(12) United States Patent
Cordes

(10) Patent No.: US 11,665,870 B2
(45) Date of Patent: May 30, 2023

(54) MODULAR SHIELDED ENCLOSURES WITH MULTI-LAYER PANELS AND RELATED METHODS

(71) Applicant: Marc Cordes, Arlington, VA (US)

(72) Inventor: Marc Cordes, Arlington, VA (US)

( * ) Notice: Subject to any disclaimer, the term of this patent is extended or adjusted under 35 U.S.C. 154(b) by 301 days.

(21) Appl. No.: 16/033,114

(22) Filed: Jul. 11, 2018

(65) Prior Publication Data
US 2019/0029147 A1 Jan. 24, 2019

Related U.S. Application Data

(60) Provisional application No. 62/531,317, filed on Jul. 11, 2017.

(51) Int. Cl.
| | |
|---|---|
| H05K 9/00 | (2006.01) |
| B32B 1/00 | (2006.01) |
| G21F 7/015 | (2006.01) |
| G21F 3/04 | (2006.01) |

(52) U.S. Cl.
CPC ............ *H05K 9/0003* (2013.01); *B32B 1/00* (2013.01); *G21F 3/04* (2013.01); *G21F 7/015* (2013.01); *H05K 9/0088* (2013.01)

(58) Field of Classification Search
CPC .................................................. H05K 9/0003
See application file for complete search history.

(56) References Cited

U.S. PATENT DOCUMENTS

| | | | | |
|---|---|---|---|---|
| 4,733,013 A * | 3/1988 | Hemming | ............ | H05K 9/0001 174/373 |
| 4,890,083 A * | 12/1989 | Trenkler | ............ | H01B 11/1008 335/304 |
| 5,170,009 A * | 12/1992 | Kadokura | .............. | C09D 5/448 174/363 |
| 8,872,042 B2 * | 10/2014 | Cordes | ................. | H05K 9/0001 174/380 |
| 2003/0198800 A1 * | 10/2003 | Hoffman | .................. | A61N 1/16 428/323 |
| 2004/0204255 A1 * | 10/2004 | Murphy | .................. | E04H 15/22 472/134 |
| 2013/0194772 A1 * | 8/2013 | Rojo | ...................... | H04Q 1/112 361/818 |
| 2017/0059190 A1 * | 3/2017 | Stefanski | ............... | G05B 15/02 |

\* cited by examiner

*Primary Examiner* — Hung V Ngo
(74) *Attorney, Agent, or Firm* — Capitol Patent & Trademark Law Firm, PLLC

(57) ABSTRACT

A plurality of different sized and shaped lightweight, shielded enclosures can be configured from a plurality of lightweight, shielded walls that attenuate one or more electromagnetic frequencies.

10 Claims, 28 Drawing Sheets

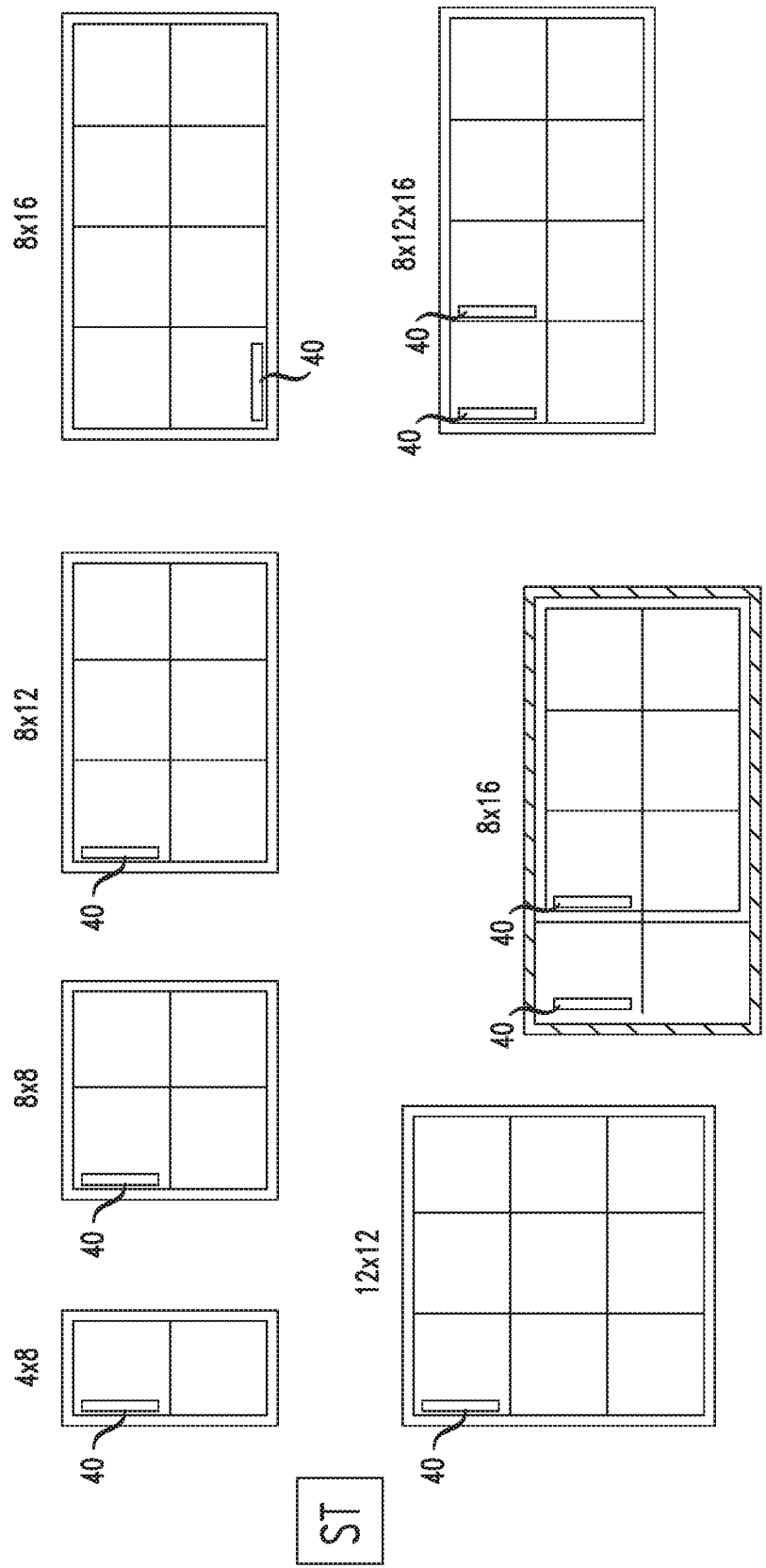

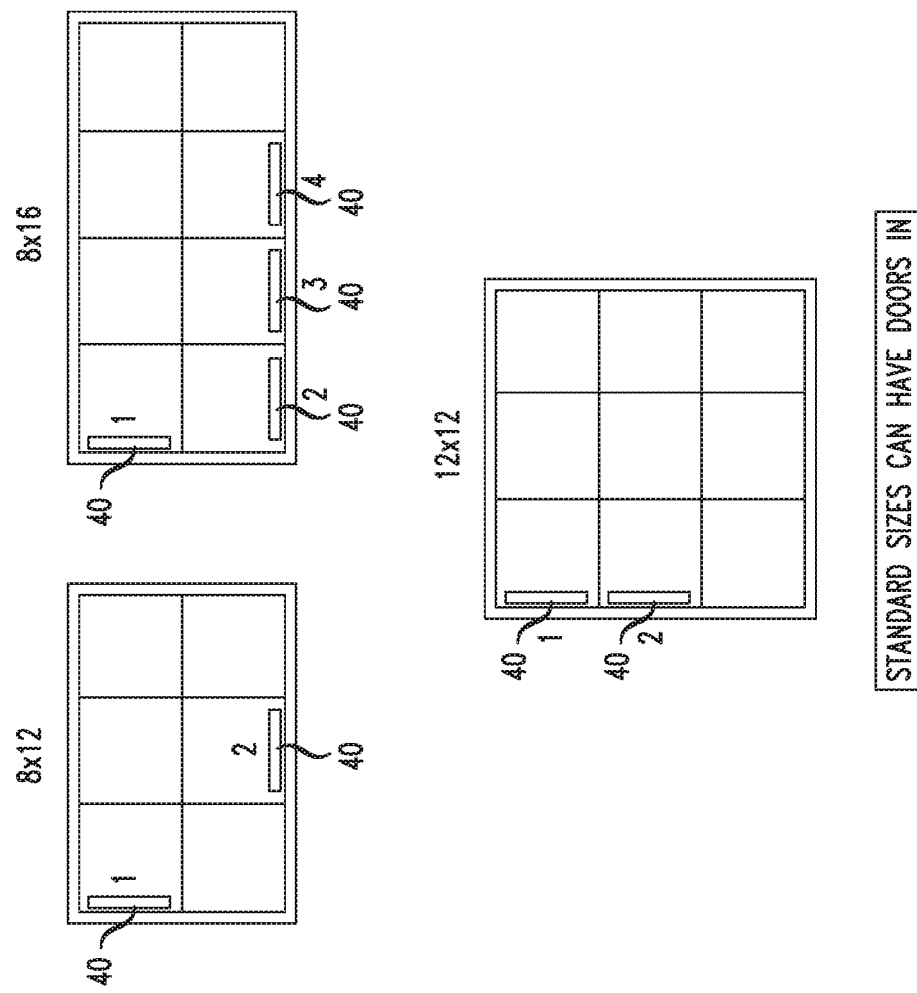

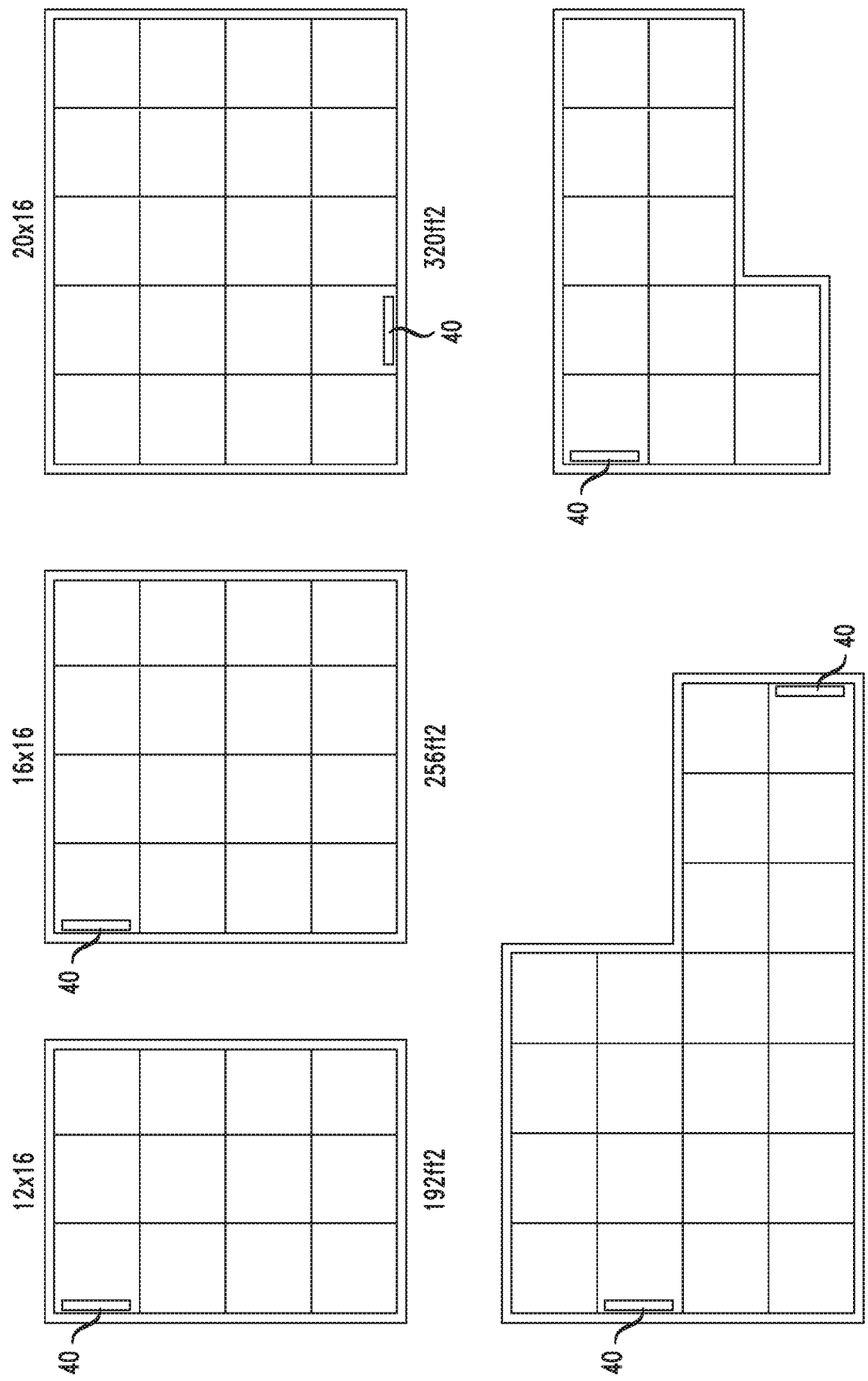

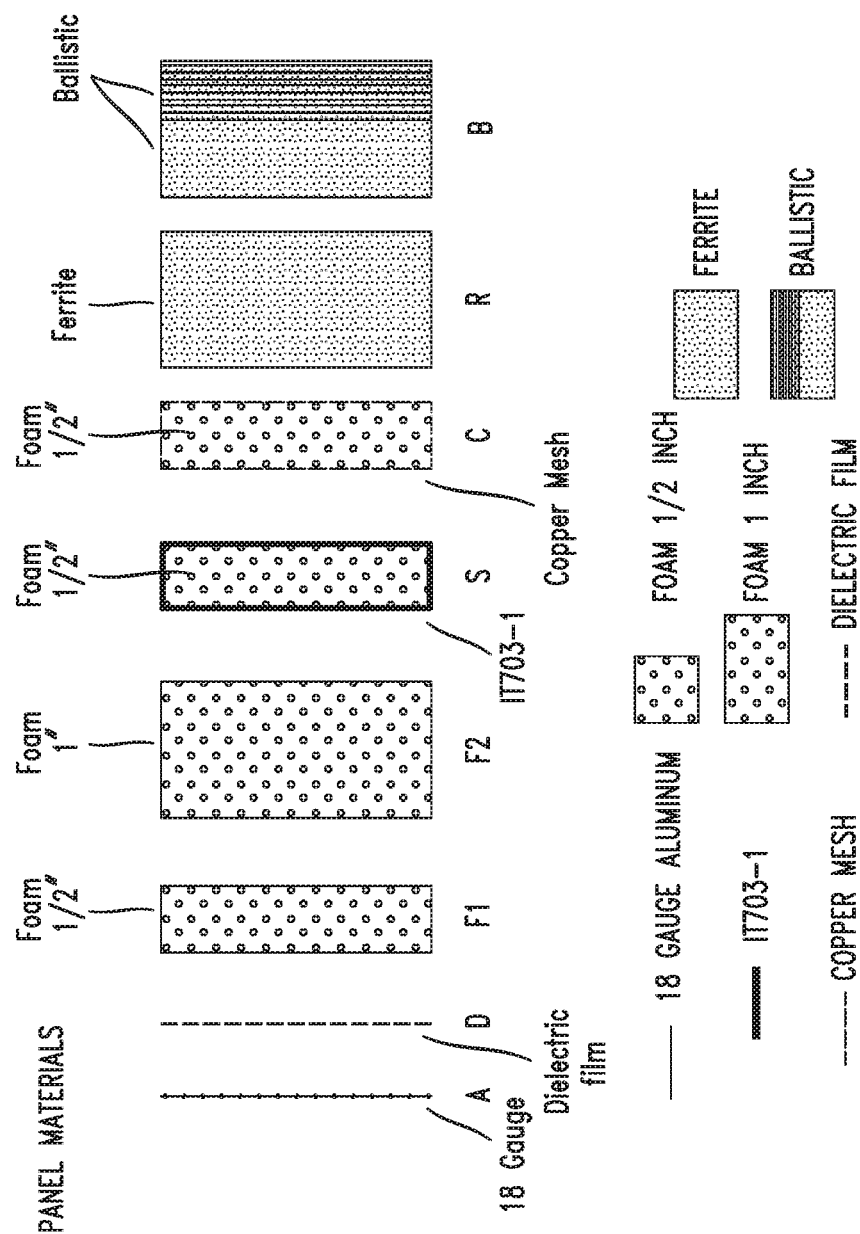

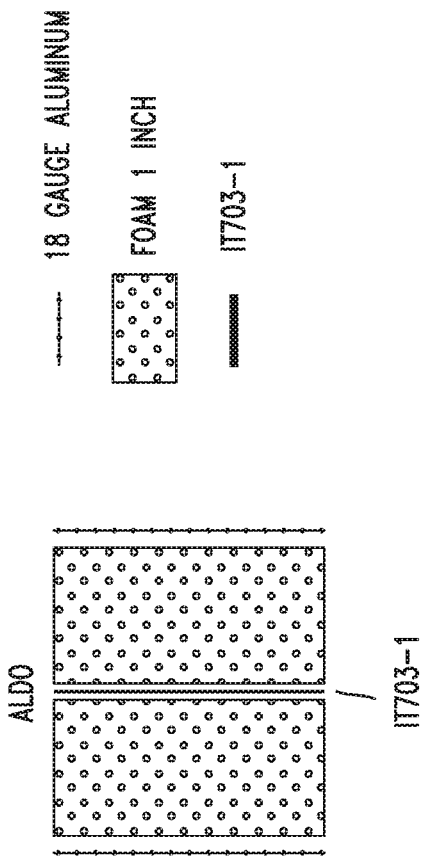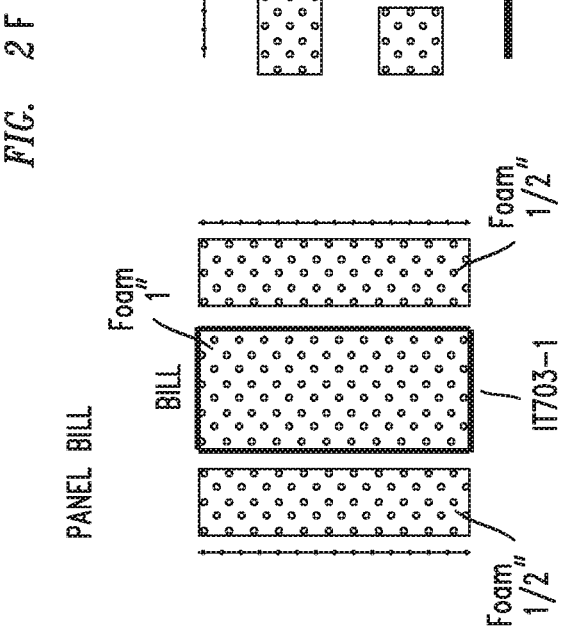

FLOOR PANELS

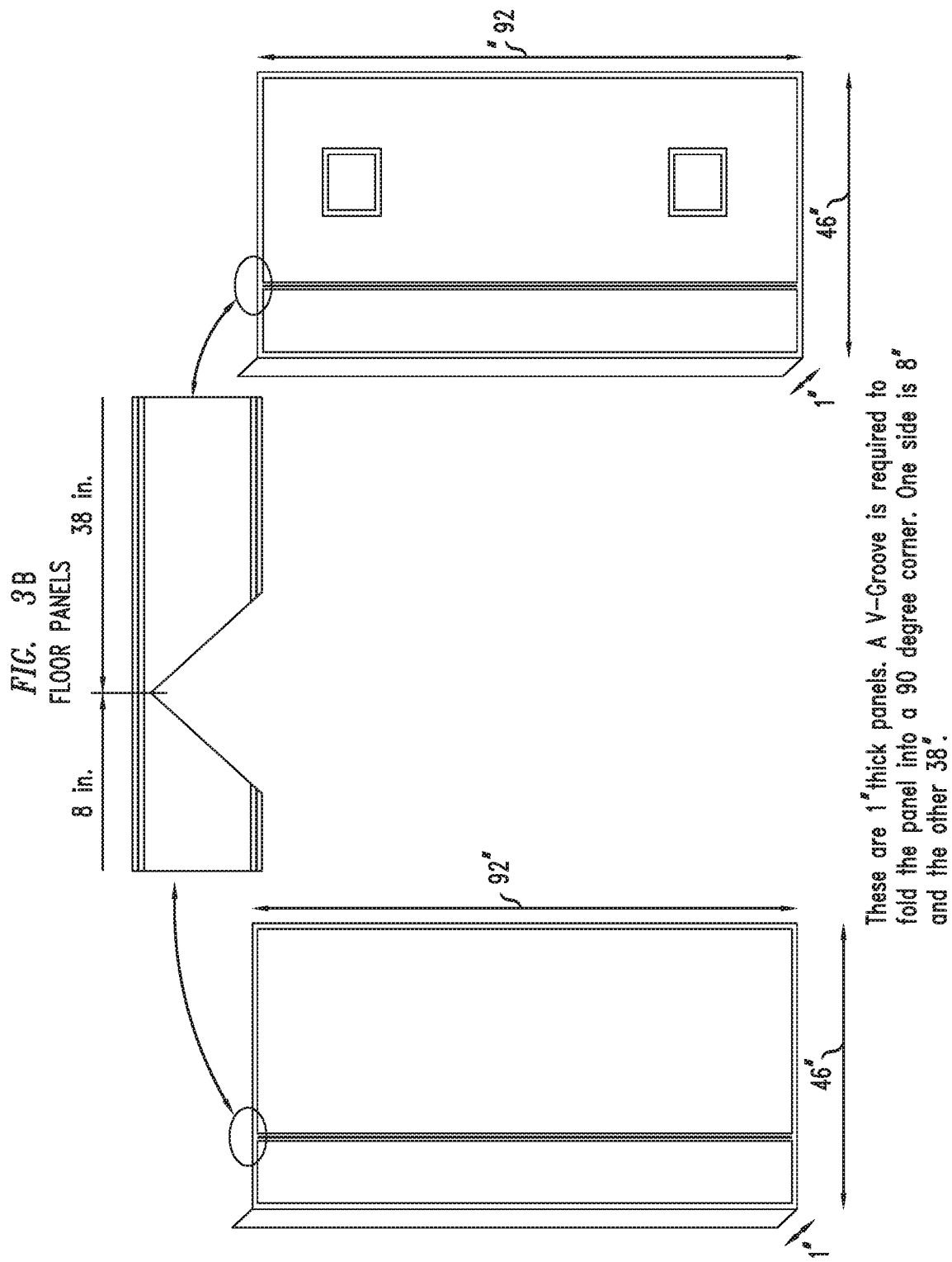

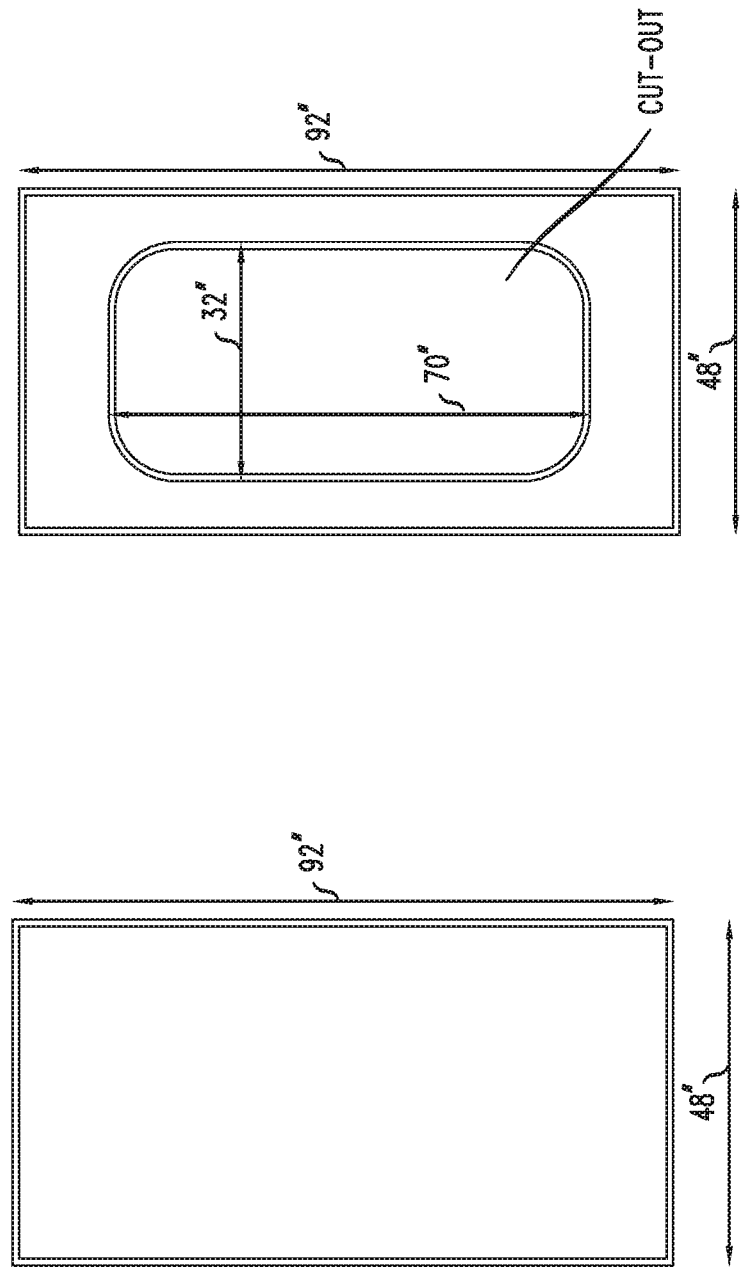

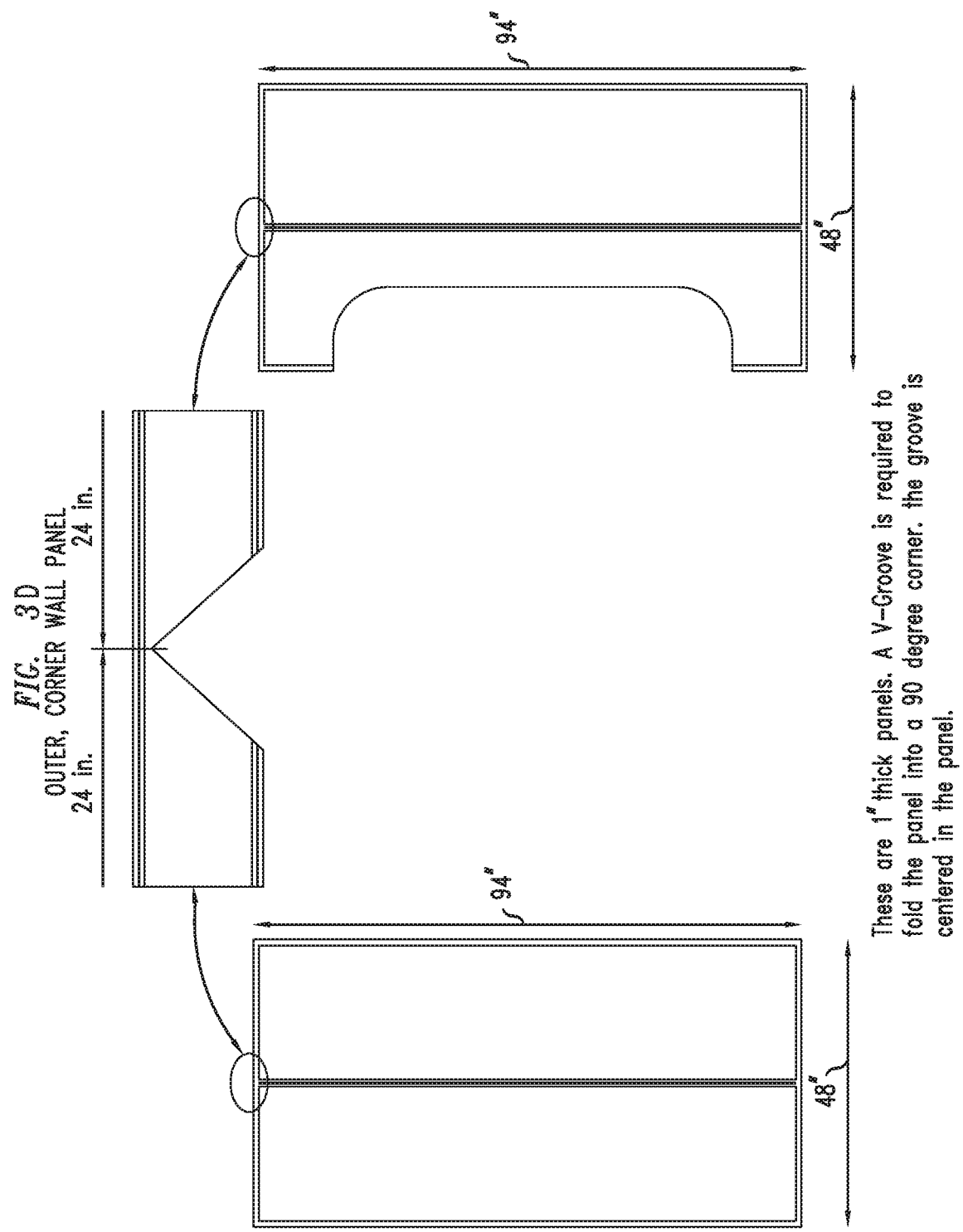

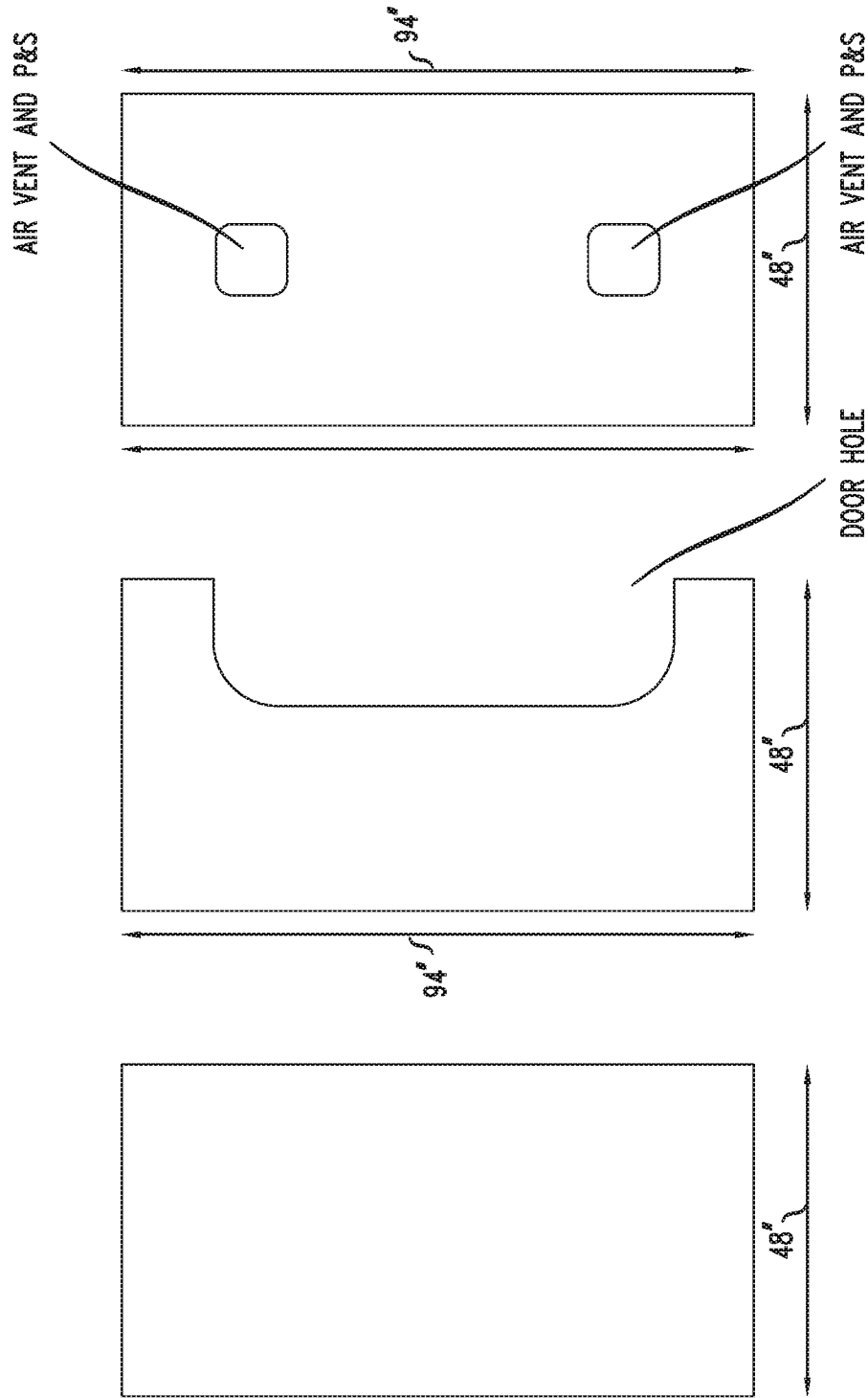

CEILING PANELS

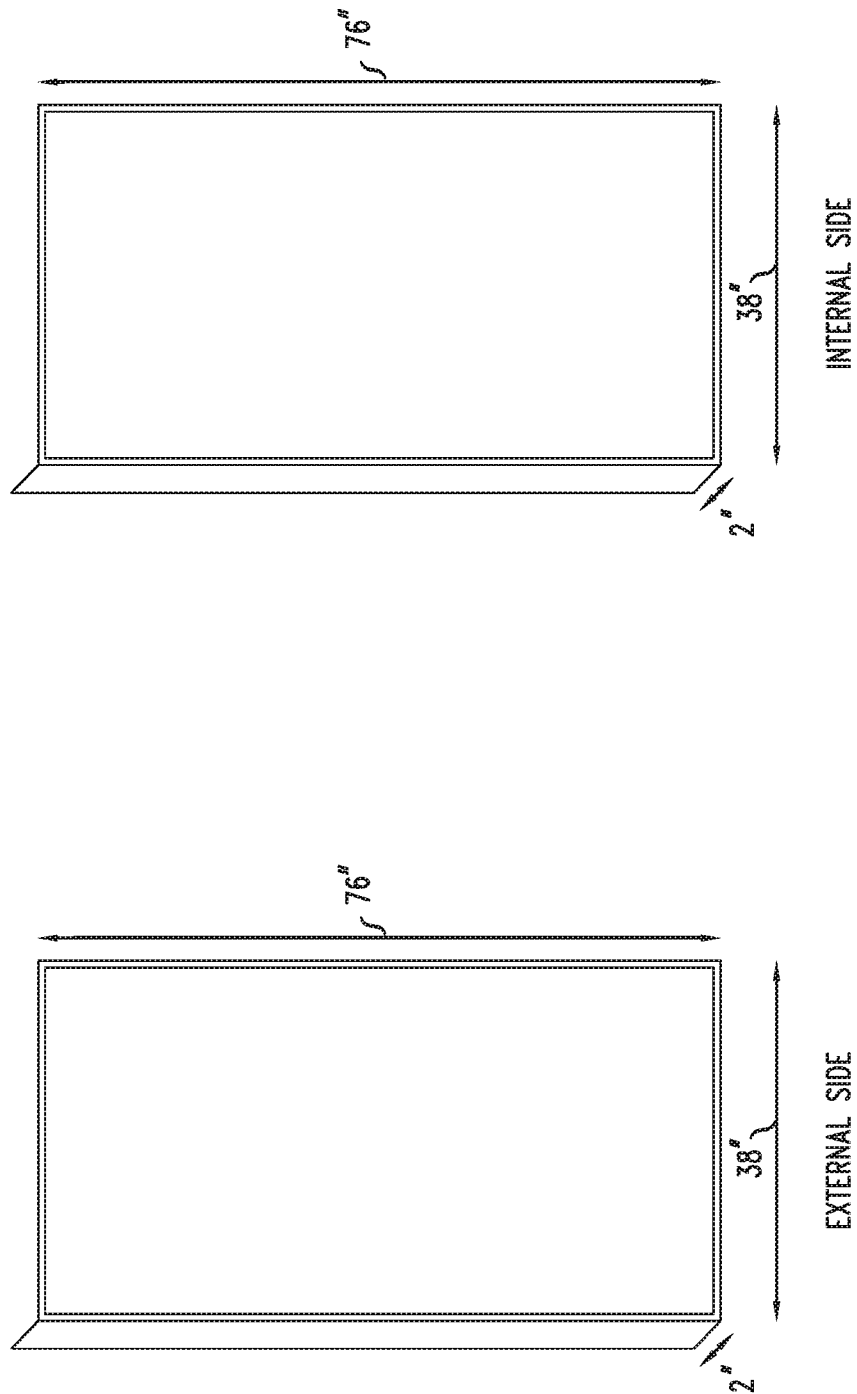

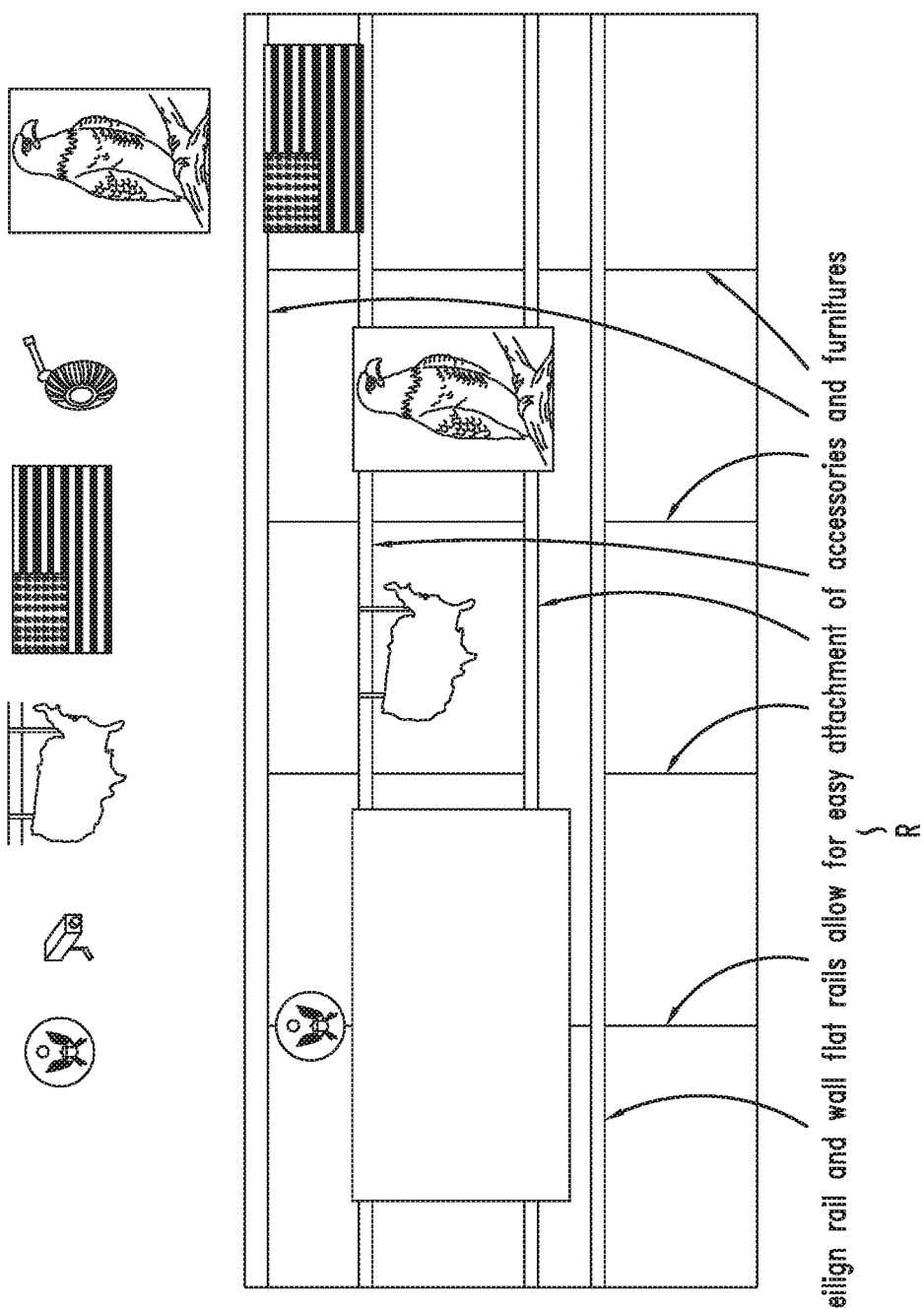

Tables and Seats

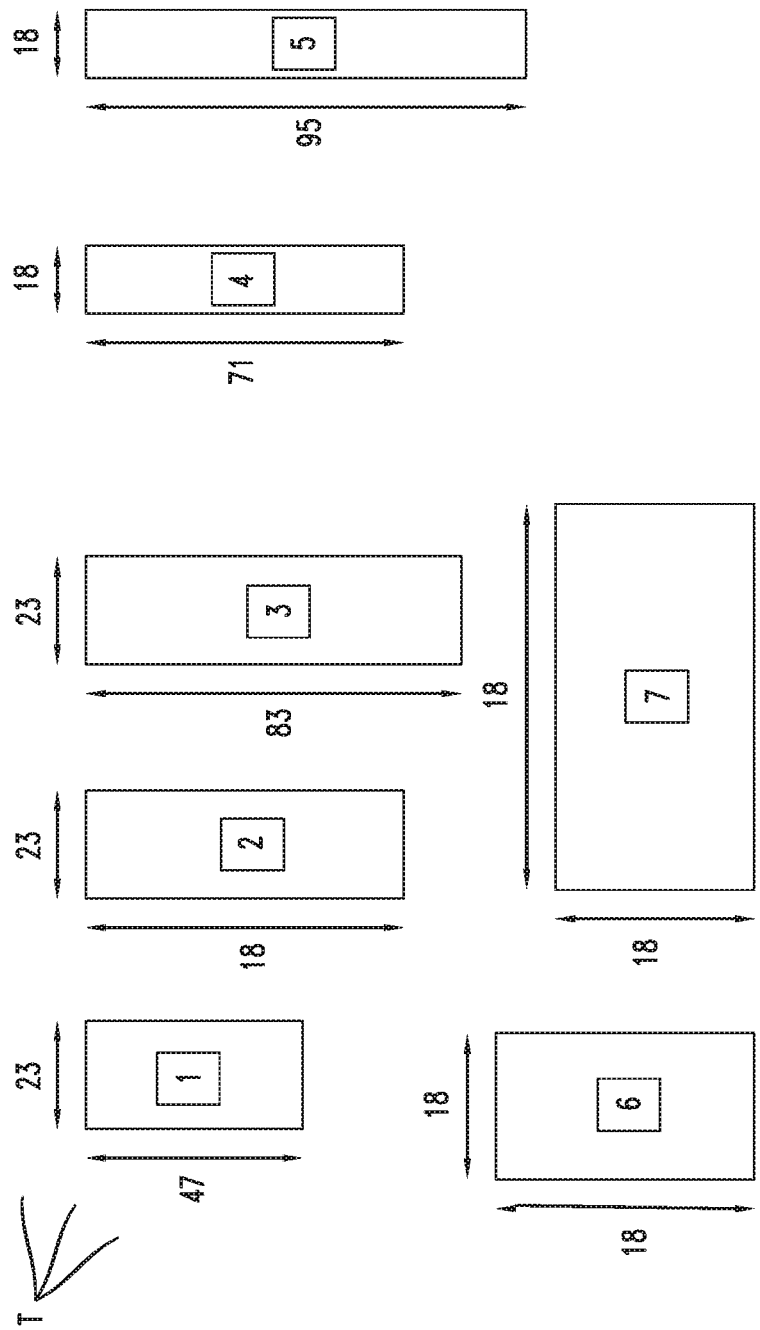

Surveillance Cameras

MODULAR SHIELDED ENCLOSURES WITH MULTI-LAYER PANELS AND RELATED METHODS

RELATED APPLICATION

The present application claims priority to U.S. Provisional Application No. 62/531,317 filed Jul. 11, 2017 (the "'317 application") and is related to Provisional Application No. 62/531,312 filed Jul. 11, 2017 (the "'312 Application"), and to U.S. application Ser. No. 13/471,401 filed May 14, 2012 (the "'401 application"). The present application incorporates by reference herein in full the entire disclosures of the '317, '312 and '401 applications as if set forth in full herein.

BACKGROUND

Keeping communications secret from an adversary or competitor has been the challenge of the military, agencies of the federal government as well companies that are targets of corporate espionage. The challenge becomes even more difficult when communications are made from locations that do not have structures that have been built to prevent eavesdropping and the like, such as when a member of the presidential cabinet, foreign service or military travels to a foreign country, works in an embassy built by some other country or travels to a locale within the United States that is not considered secure from a communications point of view.

Secure enclosures that protect against electromagnetic interference (EMI), radio frequency interference (RF), and acoustic and electronic eavesdropping, such as TEMPEST type enclosures, have been in operation for more than fifty years. Existing, secure enclosures are very heavy. Thus, transporting such enclosures, installing and assembling them can be complicated and costly. For example, a typical enclosure may require a number of skilled workers that are trained in the proper installation of such an enclosure.

Typically, the design of existing enclosures, as well as the materials used in such enclosures, leads to installation errors and mistakes. For example, components of such enclosures may become damaged (e.g., bent) during shipment. As a result, it may be difficult to properly assemble such an enclosure and, even if assembled, the electronic security features of such an assembly may be compromised (e.g., electronic signals may leak out, or eavesdropping signals may penetrate). Often skilled workers must be available to repair damaged components. This increases the overall cost of the enclosure's installation. Worse yet, if skilled workers are not available a non-skilled worker may attempt to repair an enclosure. Unfortunately, this may lead to improper assembly and, relatedly, compromise the electronic security features of an enclosure (e.g., leakage of electronic signals).

Still further, the design of some existing enclosures makes them inherently susceptible to electronic signal leakages. For example, many existing enclosures require mechanical connections. It is very difficult to prevent signals from leaking out (or into) from such connections. The main door of an existing enclosure may weigh 600 pounds or more thus requiring precise installation. Over time, such a door may not close properly due to the weight being constantly placed on its supporting structure (hinges). Even small openings in an enclosure that are not properly sealed by such a door may lead to total compromise of the enclosures electronic security features. Existing doors also are used in conjunction with additional components to insure proper sealing of the enclosures main opening, such as "finger knives", spring conductors for example. These additional components may become out of alignment, again resulting in compromising the security features of an enclosure.

Accordingly, it is desirable to provide secure enclosures that provide an increased level of EMI/RF, Electromagnetic pulse (EMP), acoustic and electronic eavesdropping protection (i.e., attenuation) as existing enclosures, but overcome the problems associated with the existing enclosures as well as provide protection against chemical, biological and radiological (CBR) contaminants and materials (collectively "materials").

SUMMARY

The present invention provides for lightweight, shielded and accredited enclosures that meet or exceed specifications set forth in military specification MIL-STD-188-125-2 (RF shielding), STC-30 (sound transmission) and the Technical Specification for Construction and Management of Sensitive Compartmented Information Facilities, Version 1.4, IC Tech Spec—for ICD/ICS 705 dated Sep. 28, 2017.

In one embodiment, a lightweight shielded accredited enclosure may comprise a plurality of lightweight, shielded components that form one or more walls of the enclosure to support the enclosure and to attenuate one or more electromagnetic frequencies over the range of 20 MHz to 18 GHz, for example. The plurality of lightweight shielded components may comprise overlappingly configured panels.

Still further, the accredited enclosure may be further pressurized to provide protection from CBR material and comprise one or more air pressure monitors for monitoring the pressure inside the enclosure.

The present invention provides a number of different configurations of accredited enclosures. For example, one configuration forms a single chamber, where the chamber comprises a single layer of the lightweight shielded components that form the walls of the enclosure. A second configuration may be a single chamber, but where the chamber comprises a plurality of layers of the lightweight shielded components (multiple walls). Still further, another configuration may comprise the enclosure above (for reference the "first" enclosure) combined with at one additional, second enclosure that be configured within, or surround, the first enclosure, and where the second enclosure may comprise one or more layers of a plurality of overlapping, shielded components (one or more walls). Yet further, another configuration may comprise a second enclosure that includes one or more layers of a plurality of overlapping, shielded components (multiple walls) that are substantially concentric with walls of the first enclosure.

It should be understood that each lightweight shielded component making up a wall, for example, may be configured to attenuate one or more different or the same range of electromagnetic frequencies.

In an embodiment, each component itself may be composed of a number integral layers, such as layers of a conductive membrane, dielectric or a non-conductive core, one or more of the layers of a ballistic material or some combination of such integral layers.

Accredited enclosures provided by the present invention may be outfitted with a number of accessories, including one or more surveillance cameras.

In addition to the accredited enclosures described herein, the present invention also provides for methods for forming a plurality of different configurations of lightweight, shielded accredited enclosures. One such method may comprise connecting a plurality of lightweight, shielded components to form one or more walls of the accredited enclosure to support the enclosure, wherein the plurality of lightweight shielded components comprise overlappingly configured panels. When CBR protection is needed, suitable inventive enclosure may be formed by pressurizing the enclosure to provide protection from CBR material and the pressure inside (and outside) the enclosure may be monitored.

As noted, different configurations of accredited enclosures may be formed. For example a single chamber enclosure may be formed, where the single chamber comprises a single layer of lightweight shielded components (single wall), or where the single chamber may comprise a plurality of layers of the lightweight shielded components (multiple walls), where once again, each component of each layer or all of the components of given layer may attenuate a range of one or more different or the same frequencies. Alternatively, a second enclosure may be formed within, or surrounding, the first enclosure, where the second enclosure may comprise one or more layers of a plurality of overlapping, shielded components that form walls. Each component itself comprise one or more integral layers of a conductive membrane, dielectric, non-conductive core or ballistic material, for example.

BRIEF DESCRIPTION OF THE DRAWINGS

FIGS. 1B through 1D depict additional exemplary accredited enclosures according to embodiments of the invention.

FIGS. 3A through 3G depict exemplary dimensions for some exemplary floor panels, corner wall panels, inner wall panels, inner and outer ceiling panels and door panels according to embodiments of the present invention.

FIGS. 4A through 4D depict a number of different accessories and/or fixtures that may be included in an accredited enclosure, such as tables, benches, other furniture, surveillance cameras, access control and logging equipment, physical locks, cypher locks, including so-called "two-factor" locks, monitoring equipment and audio sound masking/dampening according to embodiments of the present invention.

Figure 1A:
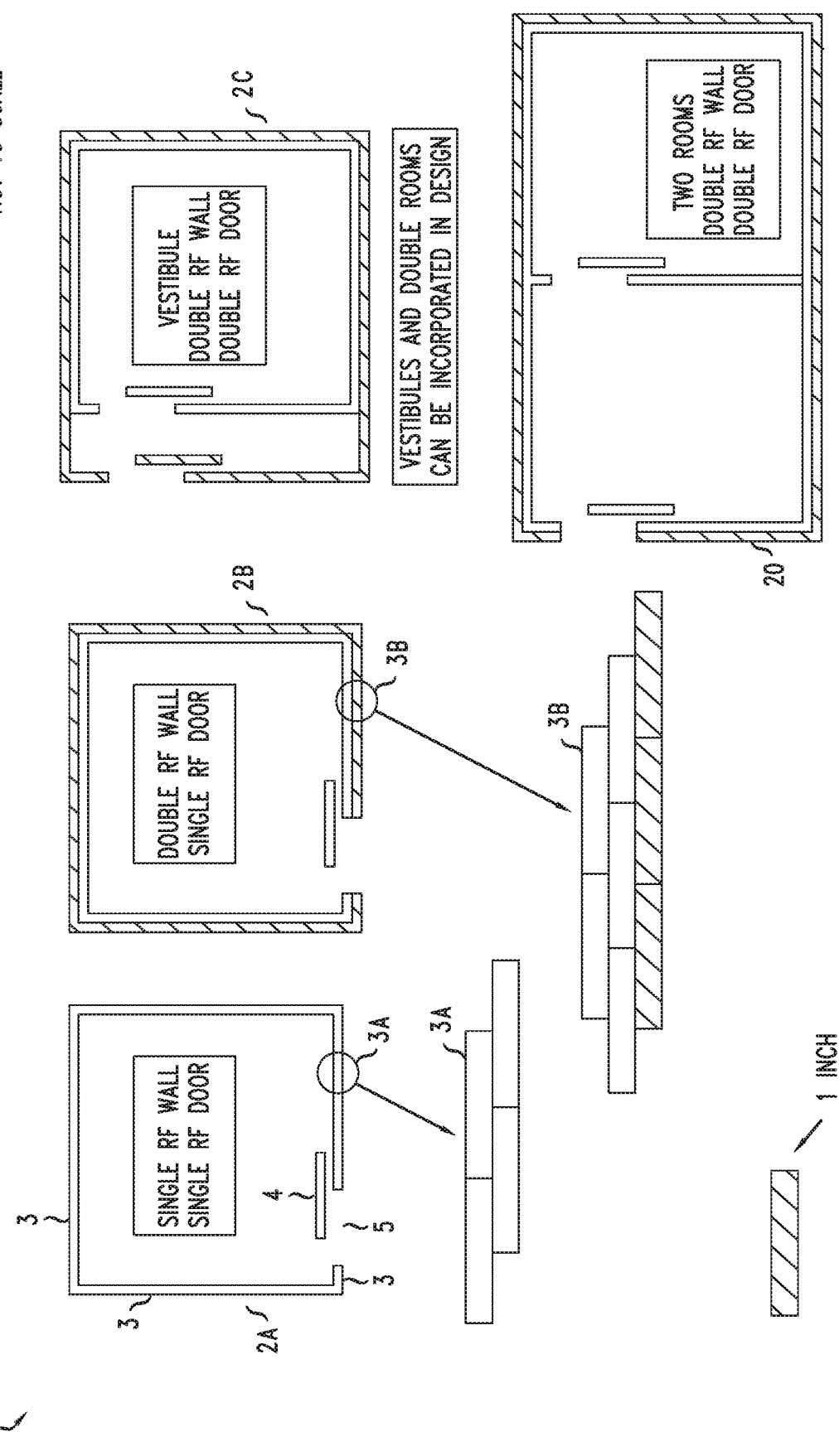
FIG. 1A depicts a system that includes a lightweight shielded accredited enclosure according to an embodiment of the invention.

To the extent that any of the figures or text included herein depicts or describes dimensional or geometrical information it should be understood that such information is merely exemplary to aid the reader in understanding the embodiments described herein. It should be understood, therefore, that other dimensions and/or geometries may be used to construct the inventive devices, systems and components described herein and their equivalents without departing from the scope of the inventions.

DETAILED DESCRIPTION OF THE INVENTION, WITH EXAMPLES

Exemplary embodiments of modular, lightweight shielded accredited enclosures with multi-layer panels and related methods are described herein. Although specific exemplary embodiments are discussed herein, there is no intent to limit the scope of the present invention to such embodiments. To the contrary, the exemplary embodiments discussed herein are for illustrative purposes. Modified and alternative embodiments may be implemented without departing from the scope of the present invention. Said another way, the exemplary embodiments presented herein are only some of the many that fall within the scope of the present invention, it being practically impossible for the inventors to describe all the many possible exemplary embodiments and variations that fall within the scope of the present invention.

It should also be understood that one or more exemplary embodiments may be described as a process or method. Although a process/method may be described as sequential, such a process/method may be performed in parallel, concurrently or simultaneously. In addition, the order of each step within a process/method may be re-arranged. A process/method may be terminated when completed and may also include additional steps not included in a description of the process/method.

As used herein, the term "and/or" includes all combinations of one or more of the associated listed items. As used herein, the singular forms "a," "an" and "the" are intended to include the plural form, unless the context and/or common sense indicates otherwise. It should be further understood that the terms "comprises", "comprising,", "includes" and/or "including", when used herein, specify the presence of stated features, systems, subsystems, steps, operations, elements, and/or components, but do not preclude the presence or addition of one or more other features, systems, subsystems, steps, operations, elements, components, and/or combinations thereof.

As used herein, the designations "first", "second", etc., is purely to distinguish one component (e.g., element, component, side, etc.) or part of a process from another and does not indicate an importance, priority or status. In fact, the component or parts of a process could be re-designated (i.e., re-numbered) and it would not affect the operation of the enclosures or methods provided by the present invention.

Yet further, when one part of an enclosure, panel or system is described or depicted as being connected to another part using "a connection" (or single line in a figure) it should be understood that practically speaking such a connection (line) may comprise (and many times will comprise) more than one physical connection.

It should be noted that the enclosures, panels and methods illustrated in the figures are not drawn to scale, are not representative of an actual shape or size and are not representative of any actual enclosure, panel, system, layout, manufacture's drawing or visual. Rather, the enclosures, panels and systems, etc., are drawn to simply help explain the features, functions and processes of exemplary embodiments of the present invention described herein and covered by the claims set forth at the end of this description. As used herein the phrase "accredited area" or "accredited enclosure" means at least a Sensitive Compartmented Information Facility (SCIF), or a Telecommunications Electronics Material Protected from Emanating Spurious Transmissions (TEMPEST) SCIF, or a Temporary Secure Working Area (TWSA) or an equivalent or higher secured facility or area.

The phrases "interior", "inner" or "internal" mean inside or within an accredited area or an accredited enclosure or a surface that can be touched by an individual inside an accredited area or accredited enclosure while the phrase "exterior", "outer" or "external" mean the opposite, i.e., outside an accredited area or accredited enclosure or a surface that cannot be touched by an individual while inside an accredited area or accredited enclosure.

As used herein, the term "embodiment" or "exemplary" refers to one example of the present invention.

As used herein the phrase "operable to" means "functions to".

Referring now to FIG. 1A, there is shown a top, cut-away view of a system 1 that includes a lightweight, shielded accredited enclosure 2A (with its top or roof removed) according to an embodiment of the invention. The accredited enclosure 2A may consist of one or more glidable shielded components 4 (e.g., a door, see the '312 application and co-pending Non-Provisional application Ser. No. 16/033,043) and a plurality of lightweight, shielded components 3 that form one or more walls of the enclosure 2A to support the enclosure 2A. In one embodiment, each lightweight, shielded component 3 provided by the present invention may weigh 30 to 50 lbs., though it may be desirable to have a weight of 40 lbs or less, for example. Each accredited enclosure may further comprise lightweight, shielded, and staggered, overlaid and/or overlapping (collectively "overlapping" or "overlappingly configured") components 3A. The glidable shielded component 4 may comprise a closure system 4 as set forth in the '312 application and co-pending Non-Provisional application Ser. No. 16/033,043. The component 4 may be operable to form an electromagnetic and CBR seal for a passageway 5 that allows ingress and egress to, and from, the inside chamber of the enclosure 2A. By "shielded" is meant capable of preventing EMI, RF, EMP, or acoustic signals from penetrating (i.e., attenuating such signals). In addition to being shielded, the accredited enclosures provided by the present invention may comprise pressurized enclosures, for example, to provide protection from CBR materials. Yet further, enclosures provided by the present invention may provide so-called "collective protection" against CBR attacks (see https://en.wikipedia.org/wiki/Collective_protection). In CBR embodiments enclosures provided by the present invention may operate under slight positive pressure to prevent dangerous CBR materials from penetrating. Accordingly, the present invention provides for one or more air pressure monitors and controllers inside such an enclosure for monitoring and adjusting the pressure inside the enclosure. Such monitoring may also provide an indication of whether seals created by gaskets used with the enclosure are good or might need to be replaced.

FIG. 1A includes a number of different variations of the system 1 where the system 1 may be formed into a single chamber accredited enclosure 2A that includes a single layer of lightweight shielded components 3A, that form a wall or walls or a single chamber enclosure 2B, the chamber comprising a plurality of layers of lightweight shielded components 3B that form a wall or walls where in either embodiment the components (panels) may overlap and in the second embodiment may also be substantially concentric with one another. In yet another embodiment the enclosure 2A or 2B (i.e., "first" enclosure") may be used with a second accredited enclosure that is either within the first enclosure 2A,2B or surrounds the first enclosure 2A, 2B thereby forming a "multi-chamber" accredited enclosure. For example, accredited enclosure 2C may be a multi-chamber (e.g., two) enclosure (i.e., an enclosure within-an-enclosure), where each enclosure comprises one or more layers of a plurality of overlapping, shielded components (panels) that form walls and its own shielded door and passageway, while accredited enclosure 2D may be a multi-chamber enclosure that includes one or more layers of a plurality of overlapping, shielded components (panels) that form walls that are substantially concentric with walls of the first enclosure. Each of the accredited enclosures described herein may include its own shielded closure system as set forth in the '312 application and co-pending Non-Provisional application Ser. No. 16/033,043 for example. The accredited enclosures 2A through 2D are just a few of the many designs covered by the inventive concepts.

The exact width, length and height of each of the accredited enclosures depicted in FIG. 1A may vary. Some exemplary dimensions are 4 feet, by 8 feet by 8 feet; or 8 feet, by 8 feet by 8 feet; or 8 feet, by 12 feet by 8 feet; or 8 feet, by 16 feet by 8 feet; or 12 feet, by 12 feet by 8 feet; or 12 feet, by 12 feet by 8 feet; or 8 feet by 12 feet, by 16 feet by 8. Exemplary designs making use of the exemplary dimensions just described are shown in FIGS. 1B through 1D. In addition, FIGS. 1B to 1D depict exemplary positions of one or more shielded closure systems 40 (numbered 1, 2, 3, 4) such as those set forth in the '312 application and co-pending Non-Provisional application Ser. No. 16/033,043. It should be understood that the dimensions set forth above and the dimensions and designs shown in the figures herein, including FIGS. 1B through 1D, are exemplary, and may be changed to fit a specific application/use/environment.

Figure 2A:
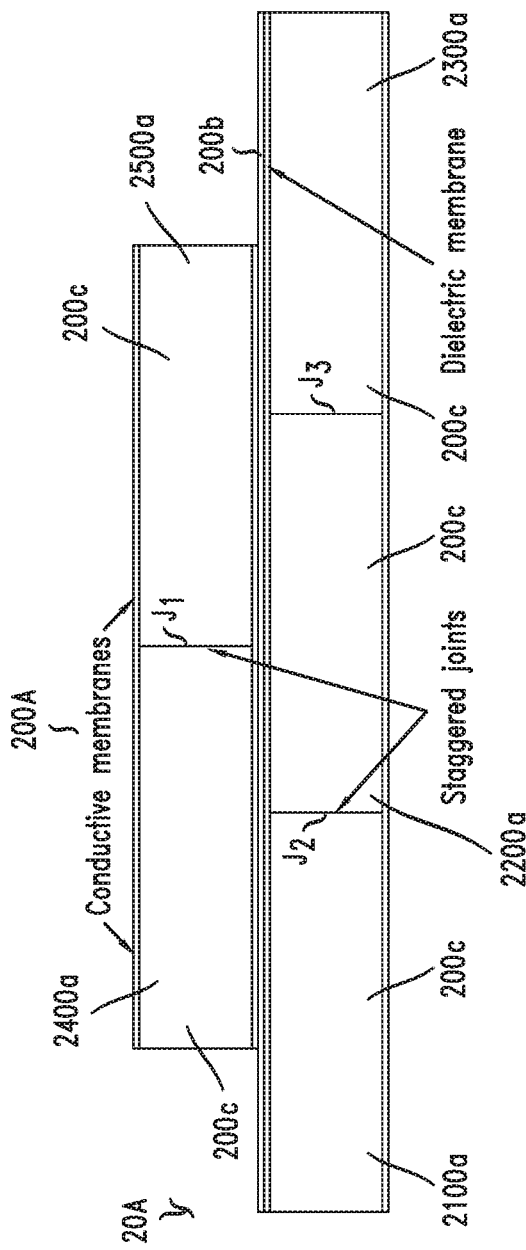
FIG. 2A depicts an exemplary panel according to an embodiment of the invention.

Referring now to FIG. 2A there is depicted an embodiment of the construction of a modular, lightweight shielded component or panel 20A (hereafter "panel"). Panel 20A may be used as a panel in FIG. 1A among other accredited enclosures described herein, for example. As depicted, panel 20A may comprise one or more layers of integral conductive membranes $200a$ (referred to as "conductive layer" because some layers need not be a membrane), dielectric membranes $200b$ ("dielectric layer" because some dielectric layers need not be a membrane) and non-conductive cores $200c$. In one embodiment, the panel 20A may comprise a plurality of staggered joints, for example joints $J_1$ through $J_3$ shown in FIG. 2A. That is to say, each integral layer $200a, b, c$ may itself comprise a plurality of elements (e.g., elements $2100a$, $2200a$, and $2300a$) where a joint (e.g., joint $J_3$) that joins two elements of one layer (e.g., elements $2200a$ and $2300a$) is not aligned with the joint ($J_1$) that joins two elements of another layer (e.g., elements $2400a$, $2500a$).

The material that is used in each layer may vary depending on the degree of shielding required. By way of non-limiting examples, conductive layers may comprise an aluminum or copper or another conductive material, while the dielectric layers may comprise a dielectric foam or a film that comprises an adhesive or non-adhesive thin plastic membrane, or any other dielectric material such as the one used in electrical tape. In an embodiment, the dielectric film may be deposited between layers by brushing or spraying a dielectric liquid, for example. Still further, a core material may be a dielectric foam but depending on the application the material may be conductive honey comb material such as aluminum or other metals or even non-conductive honeycomb materials such as epoxy impregnated paper or fabric. The dimensions of each layer may also vary depending on the degree of shielding required and other constraints, such as weight (e.g., a large enclosure may have both a thick core (beam effect) as well as high density foam which offers high shearing strength). In one embodiment, the thickness of a non-conductive core may be 2 inches. In another embodiment, the thickness of a foam core may be one inch for walls and two inches for floor, though, again, the dimensions may vary depending on the structural strength requirements.

Figure 2B:
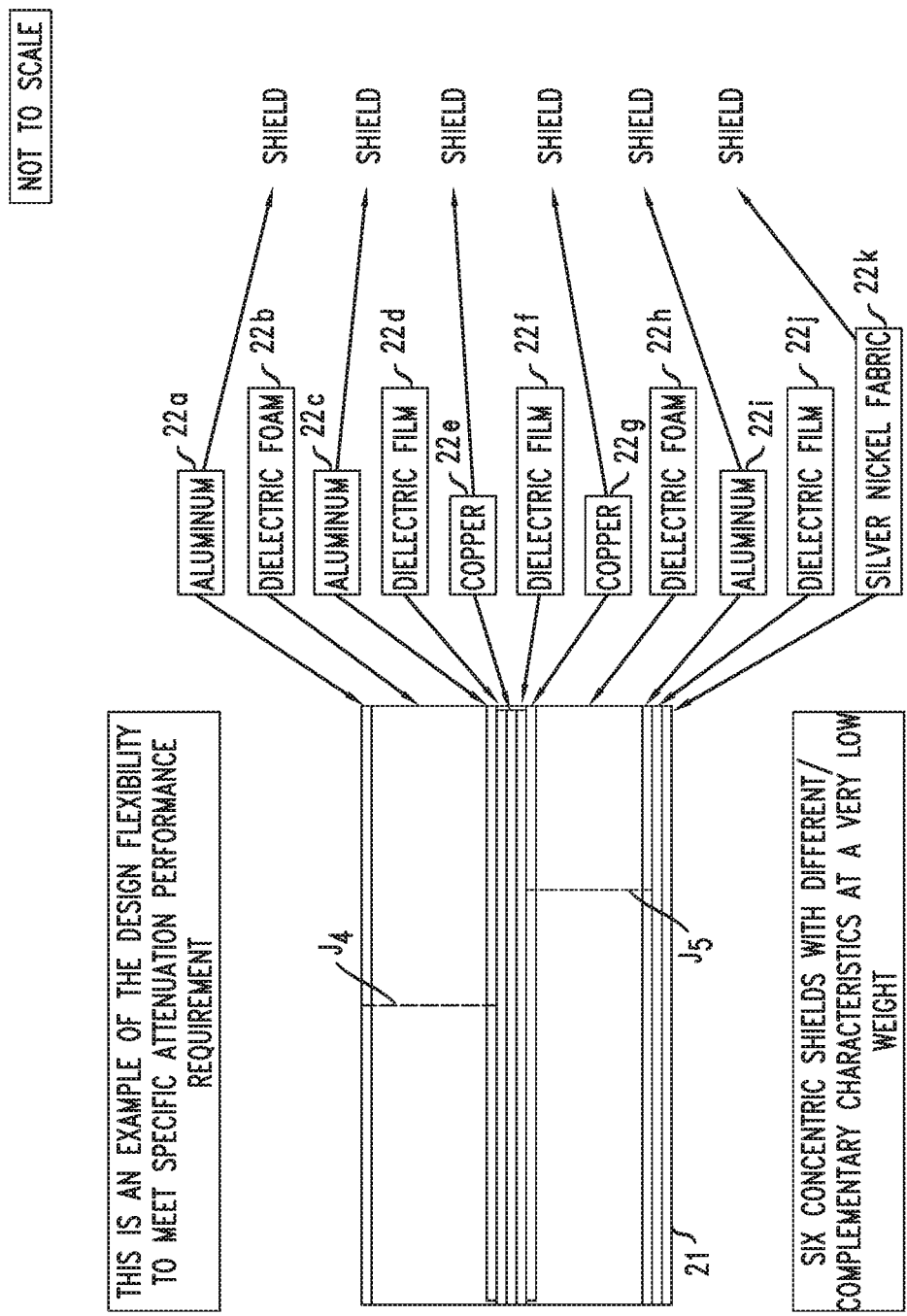
FIG. 2B depicts a section of a wall of another exemplary accredited enclosure.

FIG. 2B depicts an exemplary section 21 of a wall of another exemplary accredited enclosure. It should be understood that each section may comprise one or more components or panels. However, for ease of understanding we will focus on one panel or component for each section. As depicted, section 21 may include multiple integral layers 22a through 22k, and staggered joints $J_4$ and $J_5$. More particularly, integral layers 22a, c, e, g and i may comprise conductive layers of copper or aluminum, for example, while integral layers 22b, d, f, h and j may comprise dielectric layers (e.g., a dielectric foam or film) and integral layer 22k may comprise a fabric, such as silver nickel, for example. It should be understood, that each of the integral conductive layers shown in FIGS. 2A and 2B and elsewhere herein may be configured to attenuate one or more electromagnetic signals, such as those operating at certain frequencies. For example, each section (i.e., component or panel) making up a layer may attenuate the one or more of the same, or different frequencies. More particularly, the present invention provides for lightweight, shielded accredited enclosures that meet or exceed specifications set forth in military specification MIL-STD-188-125-2 (RF shielding, e.g., 20 MHz to 18 GHz), including the frequency attenuation specifications.

In addition, the lightweight shielded accredited enclosures provided by the present invention meets or exceeds the audio or sound attenuation specifications set forth in specification STC-30 for sound transmission, e.g., 40 dB of passive attenuation.

In addition to meeting the electromagnetic and audio/sound attenuation specifications described herein, each of the lightweight, shielded accredited enclosures provided by the present invention meets or exceeds the specifications set forth in the Technical Specification for Construction and Management of Sensitive Compartmented Information Facilities, Version 1.4, IC Tech Spec—for ICD/ICS 705 dated Sep. 28, 2017.

Accordingly, each of the layers of components (each wall) and each integral layer of each section, component or panel may act as a "shield". In the exemplary section 21 there may be six conductive membrane integral layers, thus there may be six layers that function as electronic shields. In embodiments of the invention, each of the six integral layers may be configured to attenuate similar electromagnetic signals (e.g., frequencies), or conversely, may be configured to attenuate different signals.

It should be noted that the number of integral conductive layers, dielectric layers and fabric layers and their configuration with respect to one another may vary depending on the desired attenuation characteristics. For example, their number may be more or less than six.

Figure 2D:
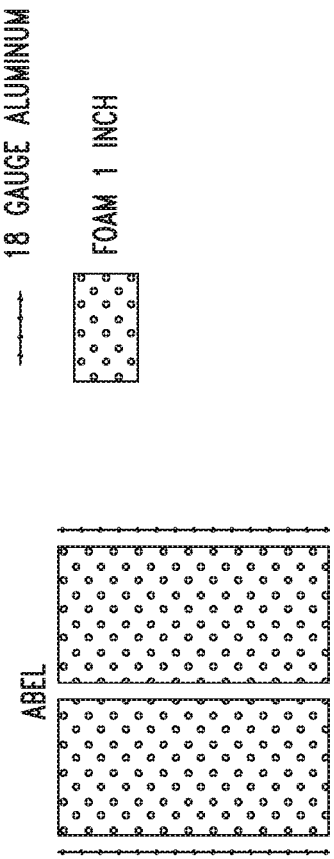
FIGS. 2D through 2R depict a number of alternative sections of a wall that may be used in an exemplary accredited enclosure.
Figure 2G:
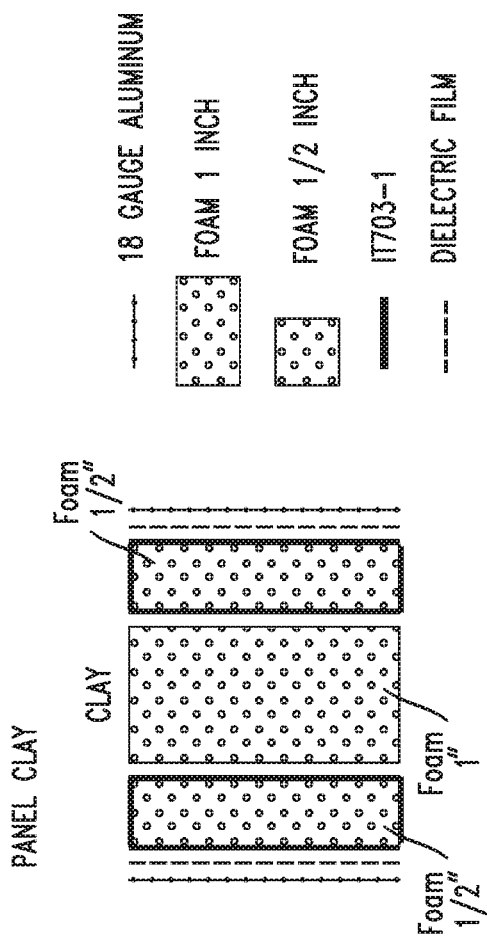
FIG. 2C depicts a key for panel materials used in sections of a wall depicted in FIGS. 2D through 2R.
FIGS. 2S and 2T depict exemplary accredited enclosures that include a plurality of panels, where each of the panels is configured as one or more of the sections depicted in FIGS. 2D to 2R.
Figure 2H:
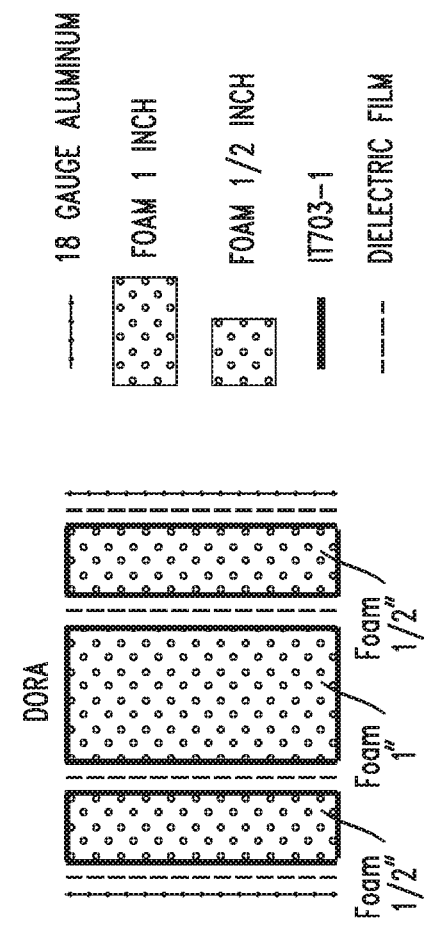
Figure 2I:
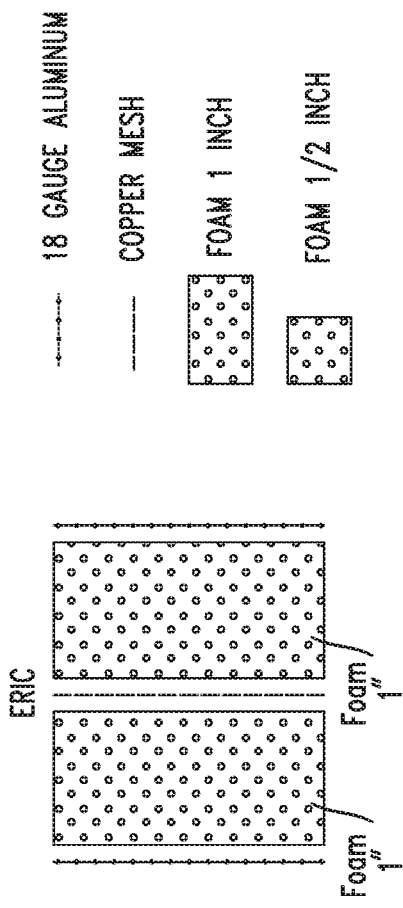
Figure 2J:
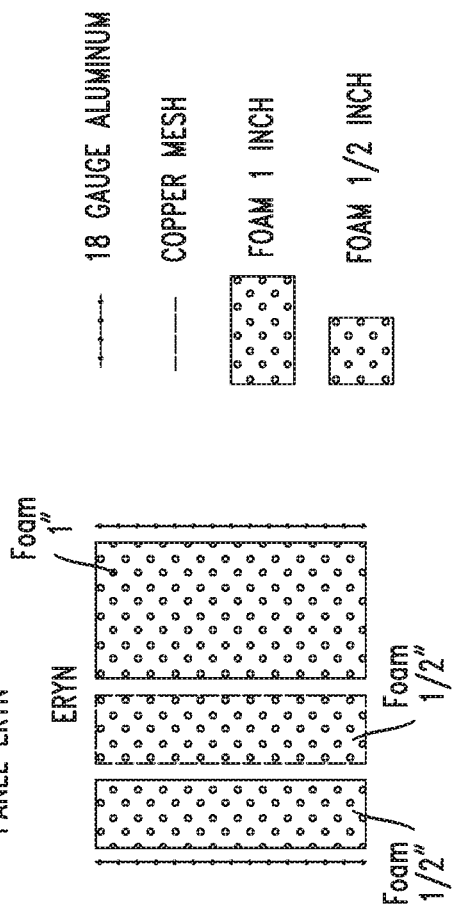
Figure 2K:
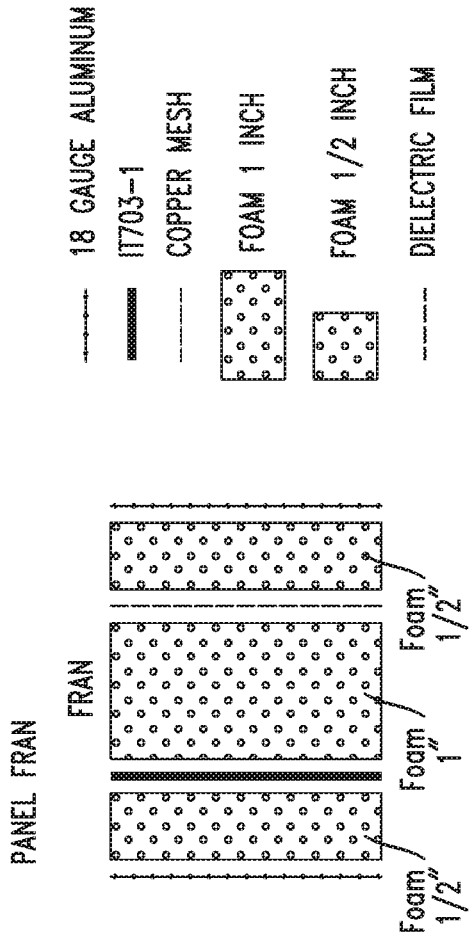
Figure 2L:
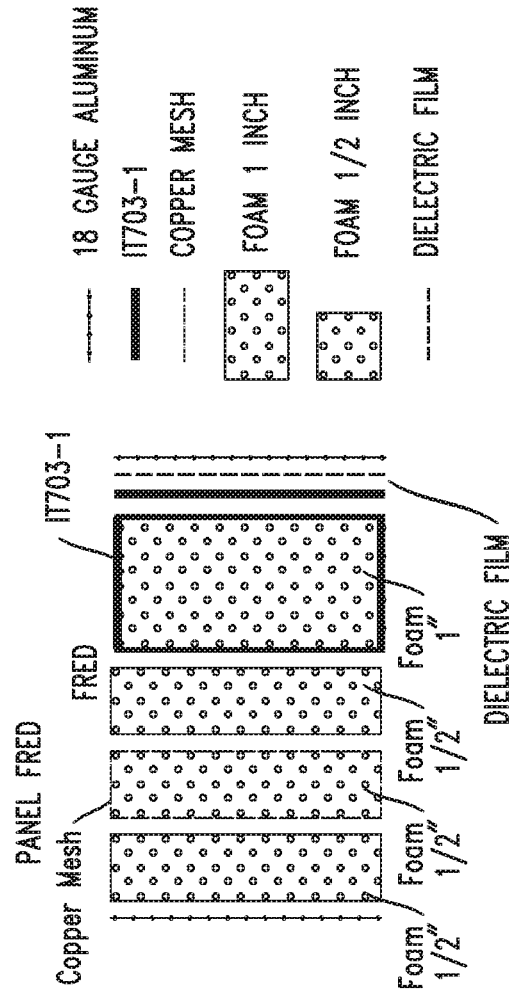
Figure 2M:
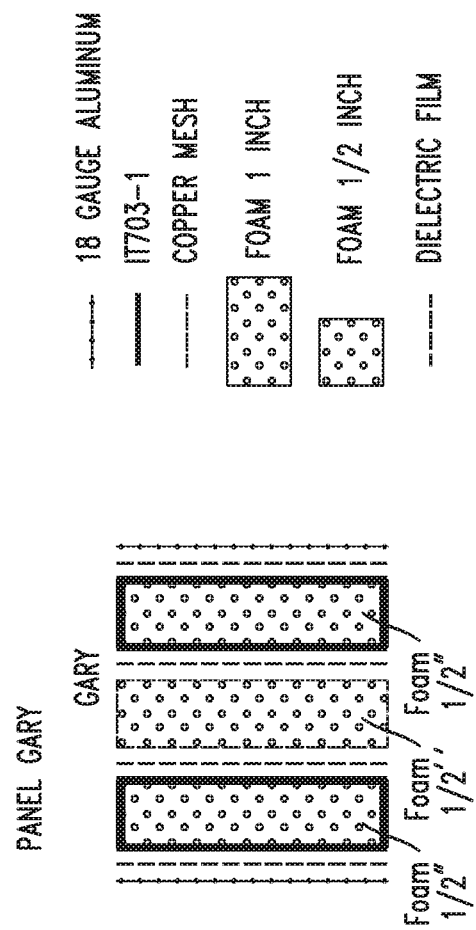
Figure 2N:
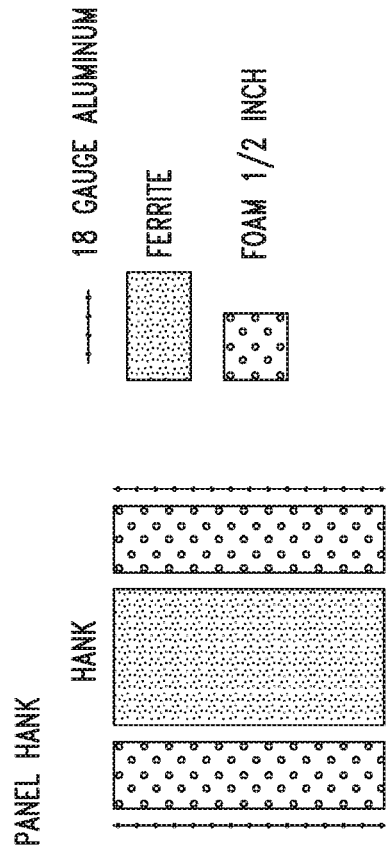
Figure 2O:
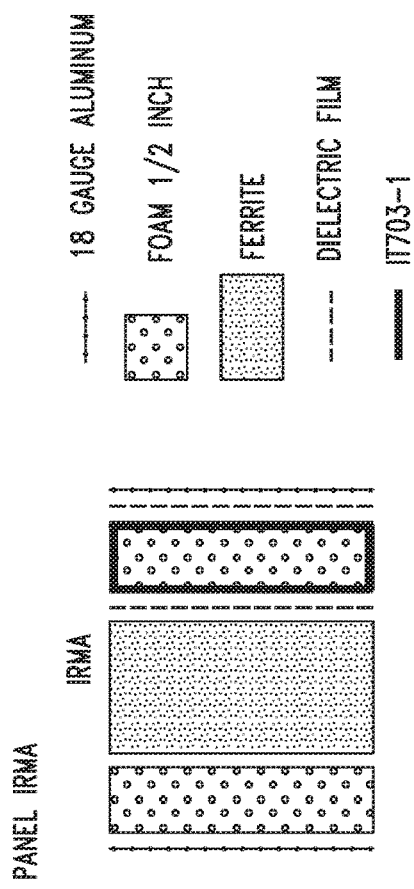
Figure 2P:
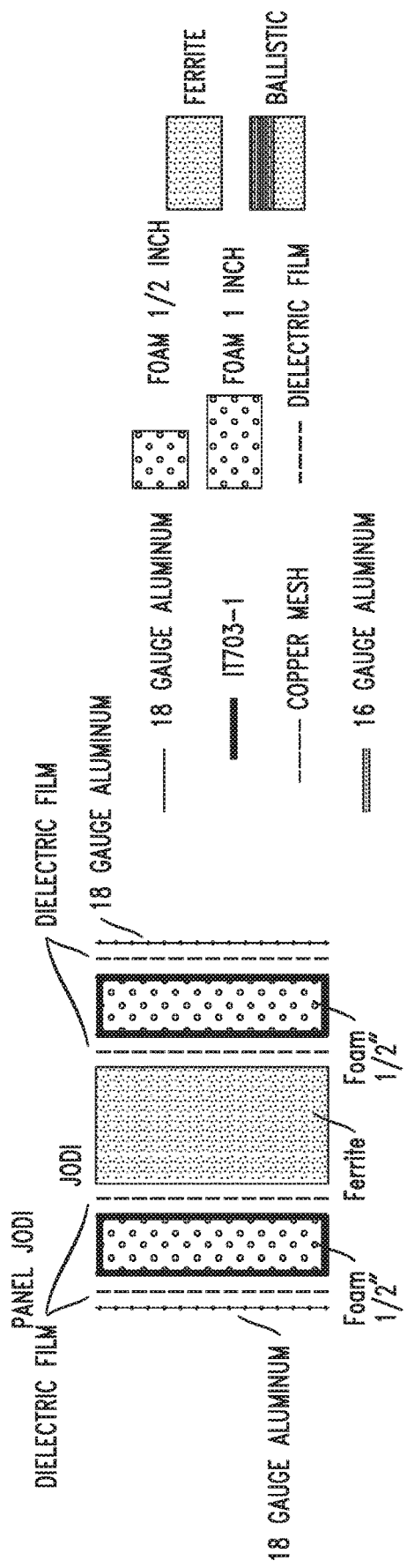
Figure 2Q:
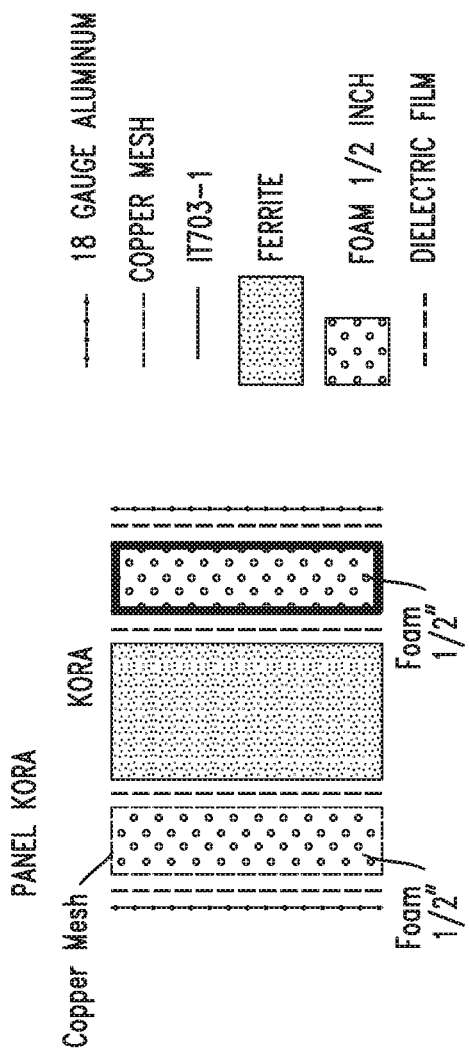
Figure 2R:
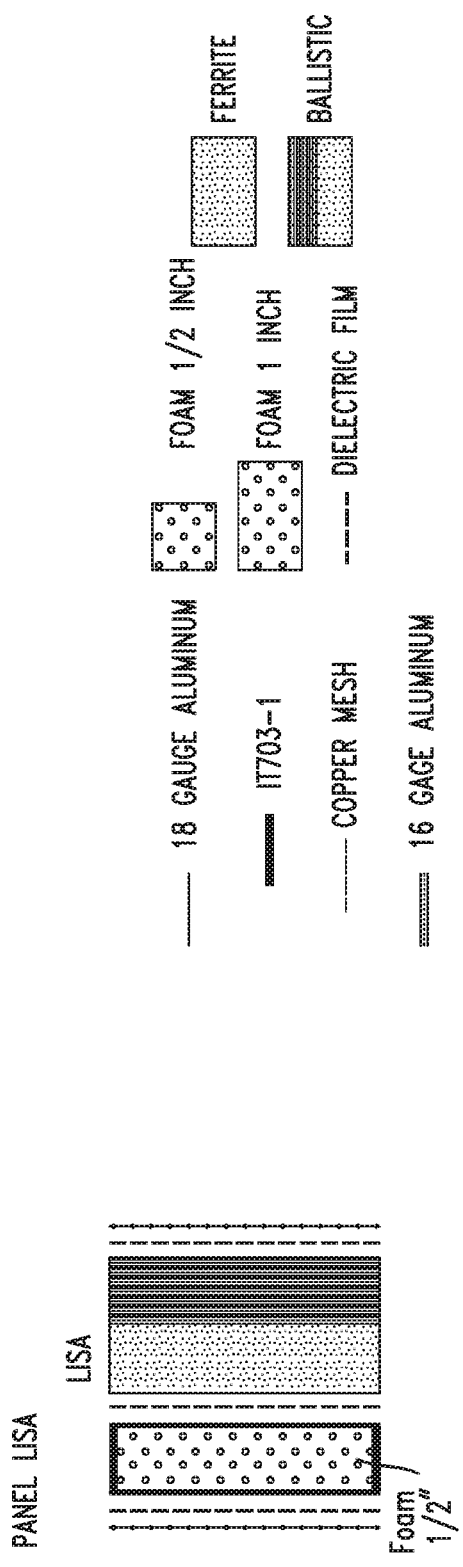
Figure 2:
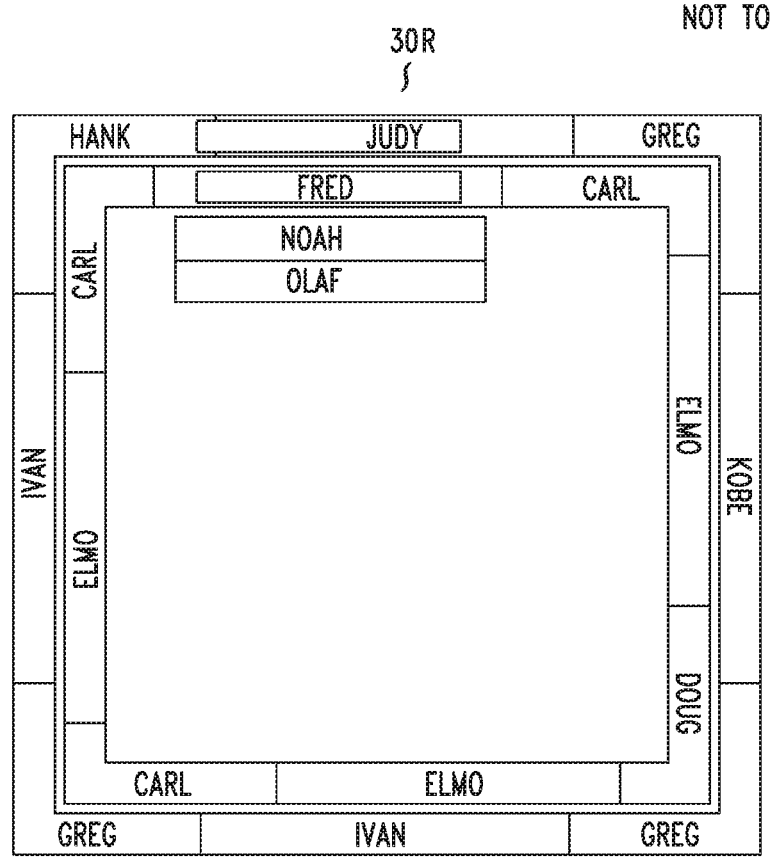

FIG. 2C depicts a legend or key that illustrates the symbols used to identify a type of conductive material, dielectric material or fabric that may be used to construct a panel section shown in FIGS. 2D through 2R.

Referring now to FIGS. 2D through 2R, there is depicted a number of alternative sections of a wall that may be used in an exemplary enclosure (each figure is associated with an exemplary name, e.g., Aldo, Bill, Clay; these are just for ease of identification in FIGS. 2D to 2R, and are otherwise non-limiting). As depicted, each section shown may include multiple, integral layers. More particularly, the integral layers depicted in FIGS. 2D through 2R may comprise a combination of conductive layers (e.g., copper, aluminum, or ferrite), dielectric membranes (e.g., a dielectric foam or film) and fabric layers, for example. It should be understood, that each of the integral, conductive membrane layers shown in FIGS. 2D to 2R may be configured to attenuate one or more electromagnetic signals, such as those operating at certain frequencies, for example. Thus, again, each of these layers may act as a shield. It should be noted that the number of conductive layers, dielectric layers and fabric layers shown in these figures is merely exemplary, and may vary depending on the desired attenuation characteristics. Yet further, the sections shown in FIGS. 2D through 2R may be combined to form even further exemplary wall sections and panels with a plurality of layers selected from among the layers shown in these figures. Still further, one or more of the layers may comprise a ballistic material and/or configuration. For example, a lightweight such as Kevlar or Dyneema or even ceramic tiles. It should be understood that layers of ballistic material may be configured as a part of a panel, wall section or closure component such as those described in the '312 application and co-pending Non-Provisional application Ser. No. 16/033,043.

Figure 2T:
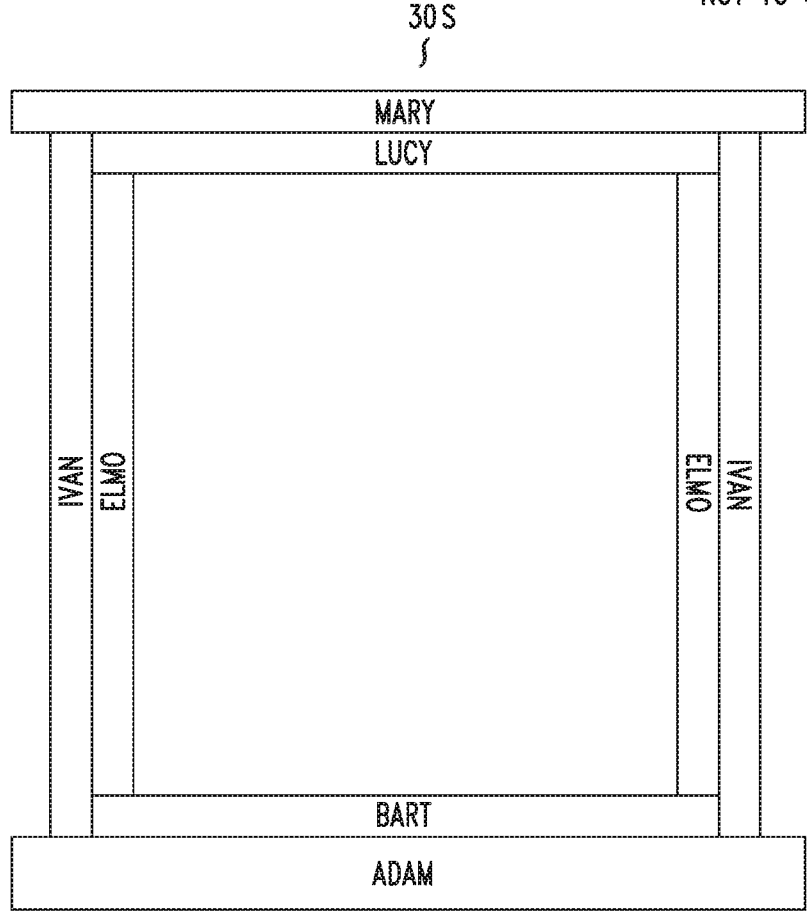
Figure 3A:
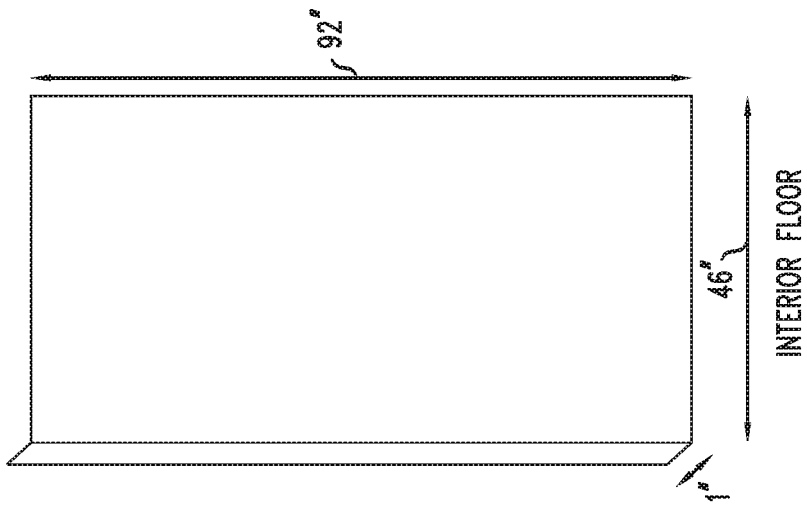
Figure 3A:
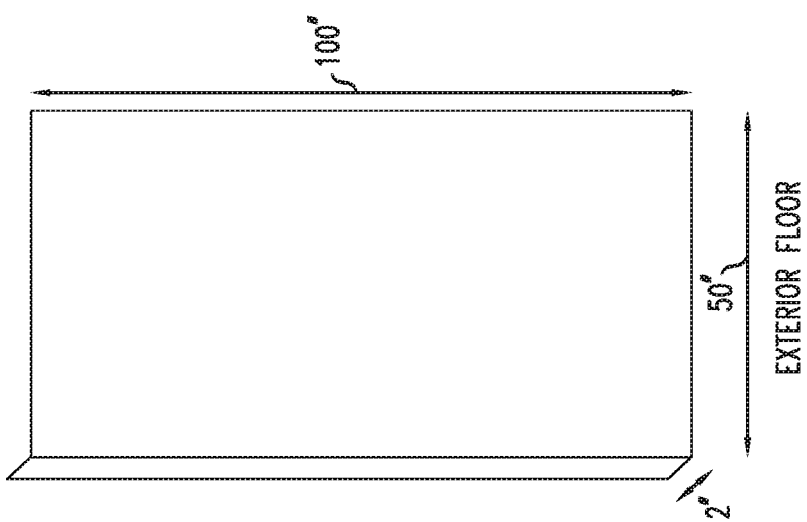
Figure 3F:
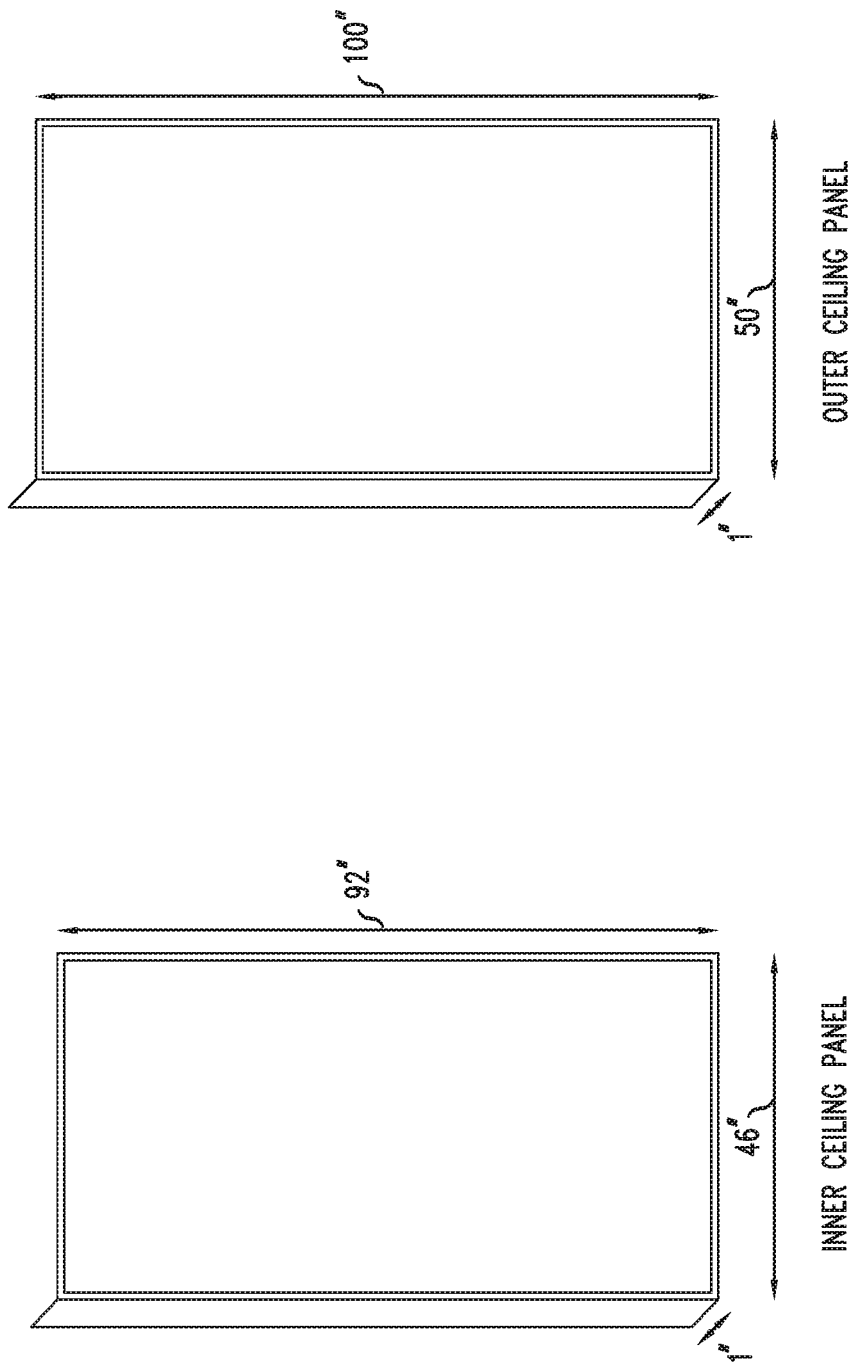

Referring now to FIGS. 2S and 2T there are depicted two exemplary enclosures 30R and 30S that include two walls, each wall comprising a plurality of panels, where each of the panels may be configured as one or more of the sections depicted in FIGS. 2D to 2R.

FIGS. 3A through 3G depict exemplary dimensions for some exemplary floor panels, corner wall panels, inner/interior wall panels, inner/interior and outer/exterior ceiling panels and door panels according to embodiments of the present invention. In addition, to connect each vertical component, wall section or wall panel may comprise the application of a conductive tape or glue to each panel or section.

Figure 4B:
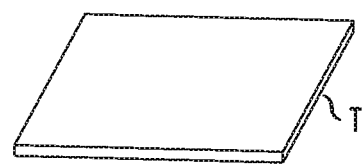
Figure 4B:
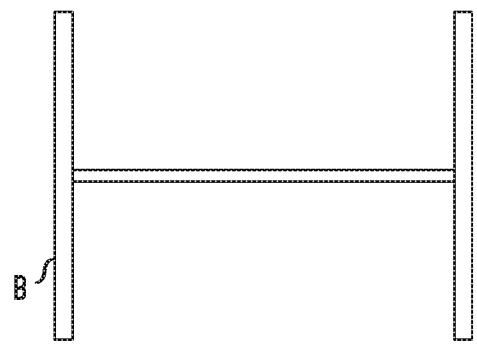
Figure 4D:
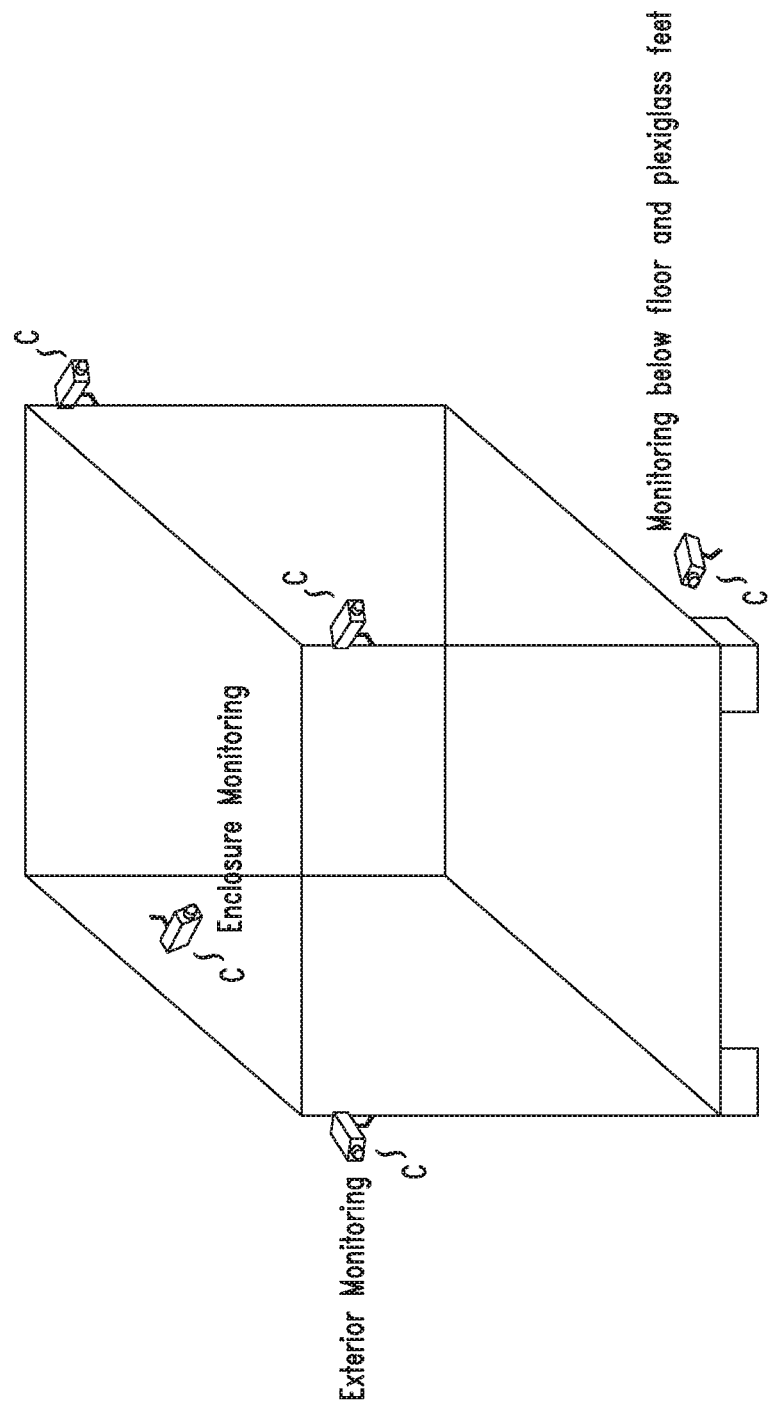

FIGS. 4A to 4D depict a number of different exemplary accessories, furniture and/or fixtures that may be included in an accredited enclosure, such as tables (see FIGS. 4B and 4C), benches, other furniture, surveillance cameras, "C" (see FIG. 4D), access control and logging equipment, physical locks, cypher locks, including so-called "two-factor" locks, motion detectors, monitoring equipment and audio sound masking/dampening. In FIG. 4A, a number of different rails, "R", may be included to hold an accessory or fixture. The tables, benches, "B", and other furniture may be positioned at a number of different positions within any sized enclosure, such as the enclosures shown in FIGS. 1B through 1D.

Again, as discussed above it should be understood that the dimensions set forth above and the dimensions and designs shown in the figures herein, are merely exemplary, and may be changed to fit a specific application/use/environment. The description above provides some examples of the scope of the present invention. It is not intended to be an exhaustive description of the many examples of the invention. Such a description would be impractical to write. Variations of the examples given herein are considered to be within the scope of the present invention.

What is claimed is:

1. A lightweight, shielded accredited enclosure comprising:
 a plurality of lightweight, multi-layered shielded components that attenuate one or more electromagnetic frequencies, and form one or more walls of the enclosure, where each wall comprises a plurality of staggered joints formed by some of the plurality of lightweight, multi-layered shielded components;

a lightweight, glidable shielded component that covers an opening in one of the one or more walls; and a closure control system for moving the glidable shielded component to cover the opening, the closure control system comprising a gliding frame structure that exerts a force on a T-section to prevent a substantial amount of force from being exerted directly on the glidable shielded component.

2. The enclosure as in claim 1 wherein the enclosure comprises a pressurized enclosure to provide protection from chemical, biological and radioactive material.

3. The enclosure as in claim 2 further comprising one or more air pressure monitors for monitoring the pressure inside the enclosure.

4. The enclosure as in claim 1 wherein the enclosure comprises a single chamber.

5. The enclosure as in claim 1 wherein each layer is configured to attenuate one or more different or the same range of electromagnetic frequencies.

6. The enclosure as in claim 1 further comprising a second enclosure within the enclosure or surrounding the enclosure, the second enclosure comprises a plurality of shielded components.

7. The enclosure as in claim 1 further comprising a second enclosure that includes one or more layers of a plurality of overlapping, shielded components that form walls that are substantially concentric with the one or more walls of the enclosure.

8. The enclosure as in claim 1 wherein the layers comprise integral layers of a conductive membrane, dielectric or a non-conductive core.

9. The enclosure as in claim 1 wherein one or more of the layers comprise a ballistic material.

10. The enclosure as in claim 1 further comprising one or more surveillance cameras.

\* \* \* \* \*